(12) United States Patent
Yin et al.

(10) Patent No.: US 12,236,883 B2
(45) Date of Patent: Feb. 25, 2025

(54) CURRENT DETECTION DEVICE

(71) Applicant: BOE TECHNOLOGY GROUP CO., LTD., Beijing (CN)

(72) Inventors: Xinshe Yin, Beijing (CN); Guangliang Shang, Beijing (CN); Hualing Yang, Beijing (CN); Xinbin Han, Beijing (CN); Jianchao Zhu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/566,530

(22) PCT Filed: Jun. 25, 2021

(86) PCT No.: PCT/CN2021/102538
§ 371 (c)(1),
(2) Date: Dec. 1, 2023

(87) PCT Pub. No.: WO2022/267055
PCT Pub. Date: Dec. 29, 2022

(65) Prior Publication Data
US 2024/0257756 A1  Aug. 1, 2024

(51) Int. Cl.
*G09G 3/3241* (2016.01)
(52) U.S. Cl.
CPC ..... *G09G 3/3241* (2013.01); *G09G 2310/027* (2013.01); *G09G 2310/0297* (2013.01); *G09G 2320/0233* (2013.01); *G09G 2320/043* (2013.01)

(58) Field of Classification Search
CPC ........... G09G 3/3241; G09G 2310/027; G09G 2310/0297; G09G 2320/0233; G09G 2320/043
See application file for complete search history.

(56) References Cited

U.S. PATENT DOCUMENTS 10,877,608 B2 *  12/2020  Vix ..................... G06F 3/0446
2013/0050292 A1    2/2013  Mizukoshi
(Continued)

FOREIGN PATENT DOCUMENTS

CN       105321455 A     2/2016
CN       106097969 A    11/2016
(Continued)

OTHER PUBLICATIONS

First Office Action for Chinese Application No. 202180001707.2, dated Dec. 7, 20023, 8 Pages.
(Continued)

*Primary Examiner* — Amare Mengistu
*Assistant Examiner* — Jennifer L Zubajlo
(74) *Attorney, Agent, or Firm* — BROOKS KUSHMAN P.C.

(57) ABSTRACT

A current detection device for detecting a current on the sense line, and compensating for a grayscale of a pixel in accordance with a difference in the detected currents, so as to provide the pixels with uniform brightness. An integration operation is performed on a sense line through an integration sub-circuitry to obtain an output voltage, and the current on the sense line is determined in accordance with the output voltage.

17 Claims, 16 Drawing Sheets

(56) References Cited

U.S. PATENT DOCUMENTS

| | | | |
|---|---|---|---|
| 2014/0375600 A1* | 12/2014 | Pan | G06F 3/044 345/174 |
| 2015/0379937 A1 | 12/2015 | Kim et al. | |
| 2017/0294159 A1 | 10/2017 | Lee et al. | |
| 2018/0197468 A1 | 7/2018 | Kim et al. | |
| 2019/0147781 A1 | 5/2019 | Park | |
| 2020/0106976 A1 | 4/2020 | Lee et al. | |
| 2020/0175921 A1 | 6/2020 | Choi et al. | |
| 2020/0202787 A1* | 6/2020 | Do | G09G 3/2007 |
| 2021/0043148 A1* | 2/2021 | Lee | G09G 3/3291 |
| 2022/0005412 A1 | 1/2022 | Xie | |
| 2022/0068198 A1 | 3/2022 | Yang et al. | |
| 2023/0005422 A1 | 1/2023 | Yang et al. | |
| 2024/0071126 A1* | 2/2024 | Yin | G09G 3/3225 |

FOREIGN PATENT DOCUMENTS

| | | |
|---|---|---|
| CN | 107293239 A | 10/2017 |
| CN | 110459179 A | 11/2019 |
| CN | 110503920 A | 11/2019 |
| CN | 110969990 A | 4/2020 |
| CN | 111276100 A | 6/2020 |
| CN | 111554220 A | 8/2020 |
| CN | 111951734 A | 11/2020 |
| CN | 112331113 A | 2/2021 |
| KR | 20190056478 A | 5/2019 |

OTHER PUBLICATIONS

SID Digest "The Pixel Circuit of Out-Pixel Compensation for LTPS PMOS OLED Displays" Xinshe Yin, et. al., BOE Technology Group Co., Ltd., Beijing, China, 2019, 4 Pages.

* cited by examiner

CURRENT DETECTION DEVICE

CROSS-REFERENCE TO RELATED APPLICATION

This application is the U.S. national phase of PCT Application No. PCT/CN2021/102538 filed on Jun. 25, 2021, which is incorporated herein by reference in its entirety.

TECHNICAL FIELD

The present disclosure relates to the field of Organic Light-Emitting Diode (OLED) display technology, in particular to a current detection device.

BACKGROUND

Deviation in a current flowing through a Driving Thin Film Transistor (DTFT) in an OLED is caused at a same grayscale due to a difference in electrical properties of the DTFT, and thereby non-uniform brightness occurs for an image displayed by a panel.

In the related art, usually an internal pixel self-compensation method is adopted, e.g., a 6T1C pixel circuitry which includes 6 TFTs, 1 capacitor and 6 elements advance (EA) signal lines. As the image quality of a display device is highly demanded, a resolution of the display device becomes higher and higher, leading to a smaller space occupied by each pixel point. Hence, there is an irreconcilable contradiction between the increasing electronic elements as well as control signal lines and a limited pixel space.

SUMMARY

An object of the present disclosure is to provide a current detection device for detecting a current of a pixel, so as to compensate for a grayscale of the pixel in accordance with a detected current difference, thereby to provide uniform brightness for the pixels.

In one aspect, the present disclosure provides in some embodiments a current detection device, including a plurality of detection circuitries each coupled to a sense line in a display panel. The detection circuitries include a current detection circuitry configured to detect a current on the sense line coupled to the current detection circuitry.

In a possible embodiment of the present disclosure, the current detection circuitry includes an integration sub-circuitry configured to perform an integration operation on the current on the sense line to obtain an integrated voltage signal, and sample the integrated voltage signal for multiple times to obtain an output voltage difference between different sampling points.

In a possible embodiment of the present disclosure, the integration sub-circuitry includes an integrator, at least two voltage collection circuitries, a voltage difference determination circuitry and a digital-to-analogue conversion circuitry. The integrator is configured to perform an integration operation on the current on the sense line to obtain an integrated voltage signal varying over time. Each voltage collection circuitry is configured to sample the integrated voltage signal and output a sampled voltage to the voltage difference determination circuitry, and the voltage collection circuitries sample the integrated voltage signal in sequence. The voltage difference determination circuitry is configured to determine the output voltage difference in accordance with voltages collected by the voltage collection circuitries, and transmit the output voltage difference to the digital-to-analogue conversion circuitry. The digital-to-analogue conversion circuitry is configured to obtain the output voltage difference, convert the output voltage difference from an analogue signal to a digital signal, and output the digital signal to a controller, so that the controller determines the current on the sense line in accordance with the output voltage difference.

In a possible embodiment of the present disclosure, the voltage collection circuitry includes a collection switch and a maintenance capacitor. One end of the collection switch is coupled to an output end of the integrator, and another end of the collection switch is coupled to a first end of the maintenance capacitor and an input end of the voltage difference determination circuitry. The first end of the maintenance capacitor is coupled to the collection switch, and a second end of the maintenance capacitor is coupled to a ground end.

In a possible embodiment of the present disclosure, the voltage difference determination circuitry includes a plurality of subtractors, each subtractor is coupled to two voltage collection circuitries, two input ends of each subtractor are coupled to the two voltage collection circuitries respectively, and an output end of the subtractor is coupled to the digital-to-analogue conversion circuitry.

In a possible embodiment of the present disclosure, one end of the sense line is coupled to the current detection circuitry, and another end of the sense line is coupled to a sensing control switch in a pixel circuitry.

In a possible embodiment of the present disclosure, the current detection circuitry further includes a reference voltage write-in circuitry and a resetting circuitry. One end of the reference voltage write-in circuitry is coupled to at least one sense line, another end of the reference voltage write-in circuitry is coupled to a reference voltage end, and the reference voltage write-in circuitry is configured to write a reference voltage into the at least one sense line. One end of the resetting circuitry is coupled to the at least one sense line, another end of the resetting circuitry is coupled to an initial voltage end and the integration sub-circuitry, and the resetting circuitry is configured to write an initial voltage into the at least one sense line.

In a possible embodiment of the present disclosure, the reference voltage write-in circuitry includes a reference level control switch, one end of the reference level control switch is coupled to the at least one sense line, and another end of the reference level control switch is coupled to the reference voltage end.

In a possible embodiment of the present disclosure, the resetting circuitry includes a follower amplifier and a resetting control switch. One end of the follower amplifier is coupled to the resetting control switch, another end of the follower amplifier is coupled to the initial voltage end, and the follower amplifier is configured to reset a voltage on the sense line to the initial voltage when the resetting control switch is in an on state. One end of the resetting control switch is coupled to at least one sense line, and another end of the resetting control switch is coupled to the follower amplifier.

In a possible embodiment of the present disclosure, the voltage difference determination circuitry further includes a plurality of followers with a high input impedance, an input end of each subtractor is coupled to two followers, one end of the follower is coupled to the subtractor, and another end of the follower is coupled to the voltage collection circuitry.

In a possible embodiment of the present disclosure, the voltage difference determination circuitry further includes a first resistor module and a second resistor module. One end of the first resistor module is coupled to a positive input end of the subtractor, and another end of the first resistor module is coupled to an output end of one follower. One end of the second resistor module is coupled to a negative input end of the subtractor, and another end of the second resistor module is coupled to an output end of the other follower.

In a possible embodiment of the present disclosure, the first resistor module includes a first resistor and a second resistor, one end of the first resistor is coupled to the output end of the follower, another end of the first resistor is coupled to the second resistor and the positive input end of the subtractor, and another end of the second resistor is coupled to a ground end. The second resistor module includes a third resistor and a fourth resistor, one end of the third resistor is coupled to the output end of the follower, another end of the third resistor is coupled to the fourth resistor and the negative input end of the subtractor, and another end of the fourth resistor is coupled to the output end of the subtractor.

In a possible embodiment of the present disclosure, the current detection circuitry includes an integration sub-circuitry, the integration sub-circuitry includes an integrator, a digital-to-analogue conversion circuitry, a multiplexer and a plurality of voltage collection circuitries, and the plurality of voltage collection circuitries includes at least two groups of voltage collection circuitries. The integrator is configured to perform an integration operation on the current on the sense line to obtain an integrated voltage signal varying over time. One group of voltage collection circuitries in the at least two groups of voltage collection circuitries are configured to sample the integrated voltage signal on the sense line for multiple times to obtain and store a plurality of sampling points, and the remaining groups of voltage collection circuitries in the at least two groups of voltage collection circuitries are configured to sample an integrated voltage signal on the other sense line for multiple times to obtain and store a plurality of sampling points when current detection is performed on the other sense line. The digital-to-analogue conversion circuitry is configured to perform analogue-to-digital conversion on the sampling point for the sense line to obtain a digital signal and output the digital signal to a controller, so that the controller determines the current on the sense line in accordance with the digital signal.

In a possible embodiment of the present disclosure, the plurality of groups of voltage collection circuitries includes a first group of voltage collection circuitries and a second group of voltage collection circuitries. One group of voltage collection circuitries in the first group of voltage collection circuitries and the second group of voltage collection circuitries are configured to sample the integrated voltage signal on the sense line for multiple times to obtain and save a plurality of sampling points, and the other group of voltage collection circuitries in the first group of voltage collection circuitries and the second group of voltage collection circuitries are configured to sample the integrated voltage signal on a next sense line for multiple times so as to obtain and save a plurality of sampling points when current detection is performed on the next sense line.

In a possible embodiment of the present disclosure, the integration sub-circuitry further includes a multiplexer, one end of the multiplexer is coupled to the plurality of voltage collection circuitries, another end of the multiplexer is coupled to the digital-to-analogue conversion circuitry, and the multiplexer is configured to enable a group of voltage collection circuitries for saving the sampling points of the sense line at a specified occasion when current detection is performed by the current detection circuitry on a next sense line.

In a possible embodiment of the present disclosure, the current detection circuitry further includes a voltage difference determination circuitry, one end of the voltage difference determination circuitry is coupled to the multiplexer, another end of the voltage difference determination circuitry is coupled to the digital-to-analogue conversion circuitry, the voltage difference determination circuitry is configured to determine an output voltage difference between the plurality of sampling points for the sense line, and the digital-to-analogue conversion circuitry is specifically configured to perform analogue-to-digital conversion on the output voltage difference to obtain the digital signal.

In a possible embodiment of the present disclosure, the specified occasion is before the sampling of an integrated voltage signal on the next sense line by the integration sub-circuitry and after the current detection on the next sense line.

In a possible embodiment of the present disclosure, the voltage collection circuitry includes an collection switch and a maintenance capacitor, one end of the collection switch is coupled to an output end of the integrator, another end of the collection switch is coupled to a first end of the maintenance capacitor and the multiplexer, the first end of the maintenance capacitor is coupled to the collection switch, and a second end of the maintenance capacitor is coupled to a ground end.

In a possible embodiment of the present disclosure, the voltage difference determination circuitry includes a plurality of subtractors, each subtractor is coupled to two voltage collection circuitries, two input ends of the subtractor are coupled to the two voltage collection circuitries through the multiplexer respectively, and an output end of the subtractor is coupled to the digital-to-analogue conversion circuitry.

In a possible embodiment of the present disclosure, the integration sub-circuitry further includes a protection circuitry, the protection circuitry includes a resistor module and a control switch connected in parallel to each other, one end of the protection circuitry is coupled to the output end of the integrator, and another end is coupled to the voltage collection circuitries.

In a possible embodiment of the present disclosure, the detection circuitry further includes a plurality of multiplexers, one end of each multiplexer is coupled to the current detection circuitry, another end of each multiplexer is coupled to the sense line, and different multiplexers are in an on state at different times.

In another aspect, the present disclosure provides in some embodiments a display device, including a display panel and the above-mentioned current detection device. The display panel includes an active area and a non-active area, the active area includes a plurality of sub-pixels and a plurality of sense lines, each sub-pixel includes a pixel circuitry, the pixel circuitries in one column are coupled to one of the sense lines, the non-active area includes a preset power source line, a reference voltage write-in circuitry of the detection circuitry and a resetting circuitry, and a first end of the current detection circuitry in each detection circuitry is coupled to a corresponding sense line.

The other features and advantages will be described hereinafter, and may become apparent or understandable partially from the embodiments of the present disclosure. The objects and the other advantages of the present disclosure may be implemented and acquired through structures specified in the description, claims and drawings.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure, and based on these drawings, a person skilled in the art may obtain the other drawings without any creative effort.

DETAILED DESCRIPTION

Figure 1A:
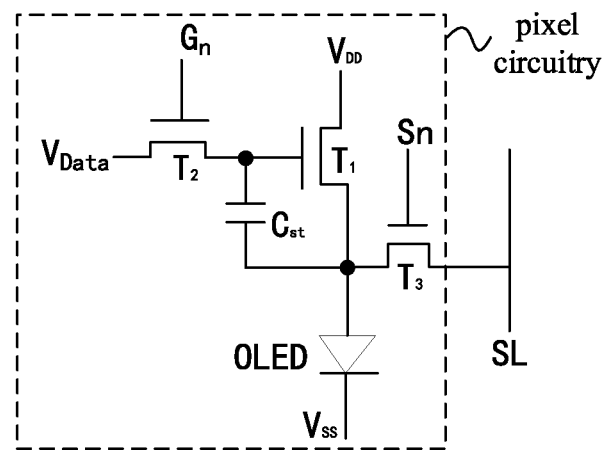
FIG. 1A is a schematic view showing a pixel circuitry of a current detection device according to one embodiment of the present disclosure.

In order to make the objects, the technical solutions and the advantages of the present disclosure more apparent, the present disclosure will be described hereinafter in a clear and complete manner in conjunction with the drawings and embodiments.

It should be appreciated that, such words as "first" and "second" involved in the specification and the appended claims are merely used to differentiate similar objects rather than to represent any specific order, and the data used in this way may be replaced with each other, so as to implement the embodiments in an order other than that shown in the drawings or described in the specification. The implementation modes described hereinafter are not all the implementation modes of the present disclosure, and they are merely examples of the device and method defined in the appended claims.

Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection.

It should be appreciated that, Shapes and sizes of the members in the drawings are for illustrative purposes only, but shall not be used to reflect any actual scale. Identical or similar reference numbers in the drawings represent an identical or similar element or elements having an identical or similar function.

Figure 2:
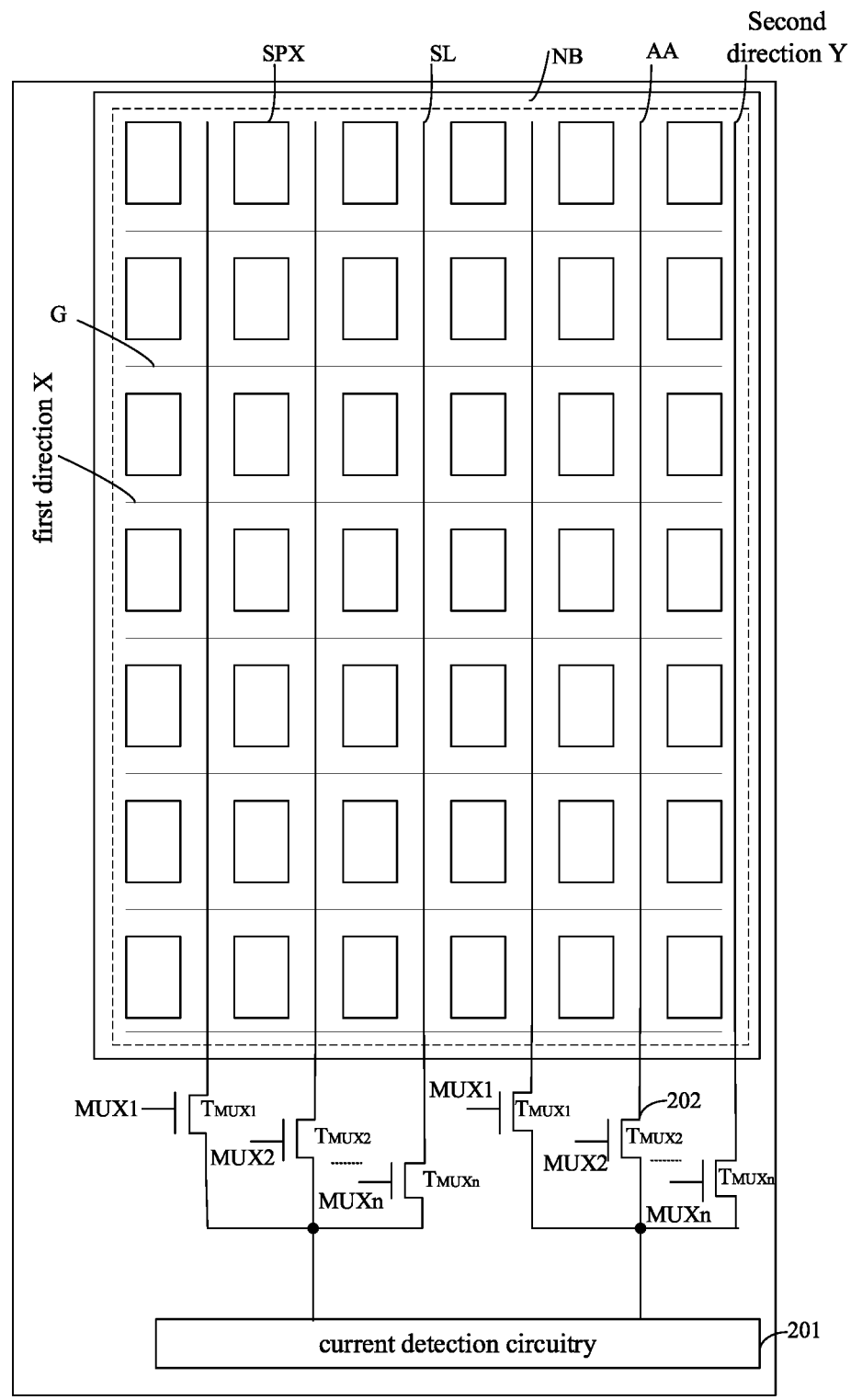
FIG. 2 is a schematic view showing a display panel including the current detection device according to one embodiment of the present disclosure.

For example, a transistor of a pixel circuitry is an N-type or P-type transistor, which will not be particularly defined herein. In the embodiments of the present disclosure, the N-type transistor is taken as an example. A 3T1C pixel circuitry in FIG. 1A includes a driving transistor $T_1$, a first switching transistor $T_2$, a sensing control switch $T_3$) and a storage capacitor $C_{st}$, and it is coupled to a sense line (SL) through the sensing control switch $T_3$. Through controlling the first switching transistor $T_2$ to be turned on, a grayscale voltage $V_{data}$ of the pixel circuitry is written into a gate electrode of the driving transistor $T_1$, so as to control the driving transistor $T_1$ to generate an operating current, thereby to drive an OLED to emit light. A driving current $I_{DS}$ of the driving transistor is calculated through $I_{DS}=k(V_{GS}-V_{th})^2=k(V_{data}-V_{OLED}-V_{th})^2$ (1), where $$k = k = \frac{1}{2}\mu C_{ox}\frac{W}{L},$$

μ represents a mobility, Cox represents a capacitance of a gate oxide layer of the driving transistor, W represents a width of a channel of the driving transistor $T_1$, L represents a length of the channel of the driving transistor $T_1$, $V_{GS}$ represents a voltage difference between a gate electrode voltage and a source electrode voltage of the driving transistor $T_1$, $V_{th}$ represents a threshold voltage of the driving transistor $T_1$, $V_{data}$ represents a data voltage at a data signal end, and $V_{OLED}$ represents a voltage at an anode of the OLED device. However, different pixels have different threshold voltages $V_{th}$ and mobilities μ, so the pixels have different brightness values at a same grayscale level. At the same time, as the service time increases, the driving transistor $T_1$ may be aged, so the drift occurs for threshold voltage and the mobility of the driving transistor $T_1$, and the difference in the brightness becomes more serious. For example, it is also necessary to provide the sense line SL in an active area AA of a display panel 200 as shown in FIG. 2 and provide the pixel circuitry with the sensing control switch $T_3$ coupled to a drain electrode of the driving transistor $T_1$. In addition, as shown in FIG. 2, one detection circuitry is coupled to a plurality of sense lines SL.

Such an electroluminescent diode as OLED and quantum dot light-emitting diodes (QLED) has the advantages of self-luminescence, low energy consumption, etc., so it has become one of the hot spots in the field of an OLED display panel. Usually, the OLED needs to be driven by a stable current so as to emit light. After the OLED is applied to the display panel 200, usually a pixel circuitry is used to drive the OLED to emit light.

During the implementation, in the embodiments of the present disclosure, as shown in FIG. 2, the display panel 200 includes an active area AA and a non-active area NB surrounding AA. The active area AA includes a plurality of pixels arranged in an array form. Each pixel includes a plurality of sub-pixels spx. Illustratively, the pixel includes a red sub-pixel, a green sub-pixel, and a blue sub-pixel, so it is able to achieve color display through mixing red, green and blue. Alternatively, the pixel includes a red sub-pixel, a green sub-pixel, a blue sub-pixel and a white sub-pixel, so it is able to achieve color display through mixing. Of course, in actual use, a color of the sub-pixel spx is designed according to the practical need, which will not be particularly defined herein.

During the implementation, the sub-pixel spx includes an OLED and a pixel circuitry for driving the OLED to emit light. The OLED includes an anode, a light-emitting functional layer and a cathode layer laminated one on another. The light-emitting functional layer includes a hole injection layer arranged between the anode and cathode layer, a hole transport layer arranged between the hole injection layer and the cathode layer, an organic light-emitting layer arranged between the hole transport layer and the cathode layer, a hole blocking layer arranged between the organic light-emitting layer and the cathode layer, and an electron transport layer arranged between the hole blocking layer and the cathode layer.

However, as shown in FIGS. 1A and 2, the active area AA of the display panel 200 further includes a plurality of scanning lines G, and the first switching transistors $T_2$ of the sub-pixels spx in one row are coupled to one scanning line, so the scanning line intersects the data lines $V_{data}$ (not shown in FIGS. 1A and 2) and the sense lines SL, and a load capacitance and a line resistance are generated between the sense line SL and the scanning line G. Due to the load capacitance and line resistance, when a signal on the scanning line G fluctuates, a current signal transmitted on the sense line SL changes too, so a current detected on the sense line SL and external compensation are inaccurate, and thereby a display effect is adversely affected.

Figure 1B:
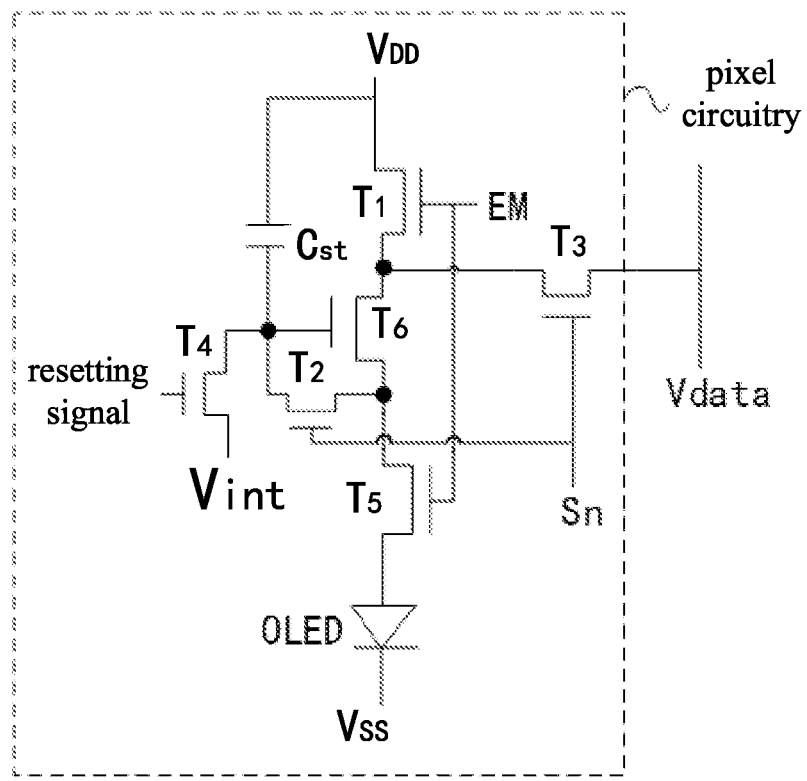
FIG. 1B is a schematic view showing a 6T1C internal compensation pixel circuitry of the current detection device according to one embodiment of the present disclosure.

In the related art, usually an internal pixel self-compensation method is adopted, e.g., a 6T1C pixel circuitry which includes 6 TFTs, 1 capacitor and 6 EA signal lines as shown in FIG. 1B. As the image quality of a display device is highly demanded, a resolution of the display device becomes higher and higher, leading to a smaller space occupied by each pixel point. Hence, there is an irreconcilable contradiction between the increasing electronic elements as well as control signal lines (including the sense lines SL and the scanning lines G) and a limited pixel space.

Apart from the internal pixel self-compensation method, an external compensation method is further provided, i.e., electrical parameters of the driving transistor $T_1$ in each pixel circuitry, e.g., the threshold voltage and the mobility, are detected by an external circuitry and stored in an external memory, and when the display panel is driven to display an image, the electrical parameters are converted into a grayscale voltage and superimposed onto display data, so as to compensate for the difference in the electrical parameters of the driving transistor.

It is found that, the external compensation method mainly depends on the detection of the electrical parameters of the driving transistor $T_1$ in the pixel circuitry. Usually, there are two detection methods, i.e., a method for detecting a voltage, and a method for detecting a current. As a principle of the method for detecting the voltage, the sense line SL is charged through the driving transistor $T_1$ in the pixel circuitry, a voltage across the sense line SL is read when the sense line SL has been charged fully, and then the threshold voltage of the driving transistor $T_1$ is calculated in accordance with the voltage.

In general, an area of the driving transistor is increased within a limited pixel space as possible, so as to increase a driving capability of the driving transistor T1. For the internal pixel self-compensation method, a storage capacitor (Cs) is small, so it is charged fully through the driving transistor very soon. For the external compensation method, the sense line SL is too long and intersects the scanning line G and the other signal lines, so the detected electrical parameters of the driving transistor are inaccurate due to the load capacitance and the line resistance. In addition, a driving current flowing through the driving transistor T1 decreases along with an increase in the voltage across the sense line SL, so it usually takes a long time period for the method for detecting the voltage, and the electrical parameters are usually detected using this method before the product leaves factory or before it is started.

Based on the above, the present disclosure provides a current detection device and a current detection method. An inventive concept of the present disclosure is summarized as follows. A driving voltage is written into a storage capacitor $C_{st}$ of a pixel circuitry, a driving transistor $T_1$ outputs a constant current to a sense line SL, an integration operation is performed on the current flowing through the sense line SL through an integration sub-circuitry to obtain an output voltage, and the current flowing through the sense line SL is obtained in accordance with the output voltage. It should be appreciated that, the pixel circuitry corresponding to the current detection device includes, but not limited to, a 6T1C internal pixel compensation circuitry in FIG. 1B, and the other pixel circuitry having a sense line, such as a 3T1C, 4T1C, 5T1C or 5T2C pixel circuitry, is also applicable, which will not be particularly defined herein. Further, regardless of the type of the pixel circuitry, a transistor coupled to the sense line in the pixel circuitry is referred to as a sensing control switch $T_3$.

Figure 3:
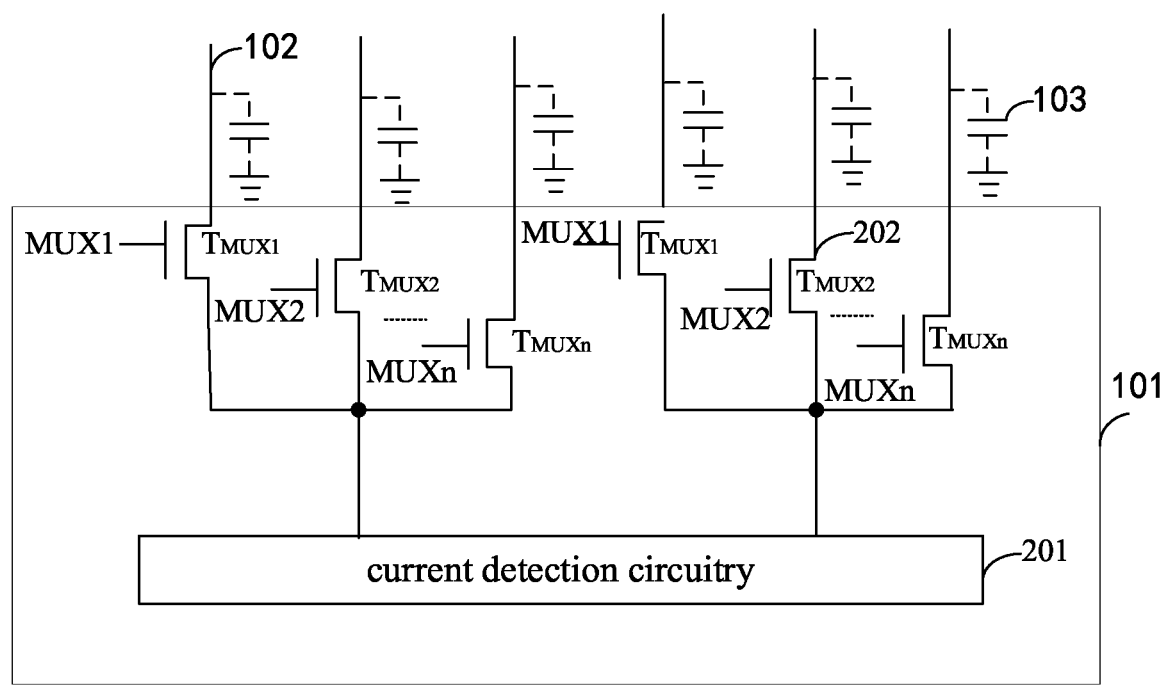
FIG. 3 is a schematic view showing the current detection device according to one embodiment of the present disclosure.

The current detection device in the embodiment of the present disclosure includes a plurality of detection circuitries, and in FIG. 3, the current detection device illustratively includes one detection circuitry. As shown in FIG. 3, the current detection device includes a detection circuitry 101 and a sense line 102. One detection circuitry 101 corresponds to at least one sense line 102 in a display panel, and it includes a current detection circuitry 201. The sense line 102 is a metal line extending along a second direction, and it is arranged at a layer different from a scanning line G extending along a first direction as shown in FIG. 2, so the sense line 102 intersects the scanning line G. At this time, a parasitic capacitor is formed at an intersection between the sense line 102 and the scanning line G, i.e., a parasitic load capacitor 103 in FIG. 3.

In some embodiments of the present disclosure, the first direction is a transverse direction, the second direction is a longitudinal direction, and the first direction X intersects the second direction Y. The first direction X, the second direction Y, and an angle between the two directions will not be particularly defined herein. For example, the angle between the first direction X and the second direction Y is within a range of 70° to 90°, with the endpoints inclusive. For example, the angle between the first direction X and the second direction Y is 70°, 75°, 85°, 90° or 80°. A specific value of the angle is set according to the practical needs and will not be particularly defined herein.

In the embodiments of the present disclosure, in order to facilitate the detection of the current on a certain sense line 102, multiplexers 202 (namely, MUX$_{1-n}$ in FIG. 2) are further provided in the detection circuitry 101, and each multiplexer 202 corresponds to one sense line 102.

One end of the multiplexer 202 is coupled to the current detection circuitry 201 and another end of the multiplexer 202 is coupled to a corresponding sense line 102. That is, each of the multiplexers 202 corresponds to at least one sense line 102, and the detection of the current on the corresponding sense line 102 is achieved through controlling the multiplexer 202 to be turned on.

In some embodiments of the present disclosure, the multiplexer 202 is a one-out-of-four multiplexer, a one-out-of-six multiplexer, a one-out-of-eight multiplexer (MUX), etc., and any other switch having a control function may also be applicable to the current detection device in the embodiments of the present disclosure.

The current detection circuitry 201 is configured to detect the current on the sense line 102 coupled to the multiplexer 202 currently in an on state.

Figure 4A:
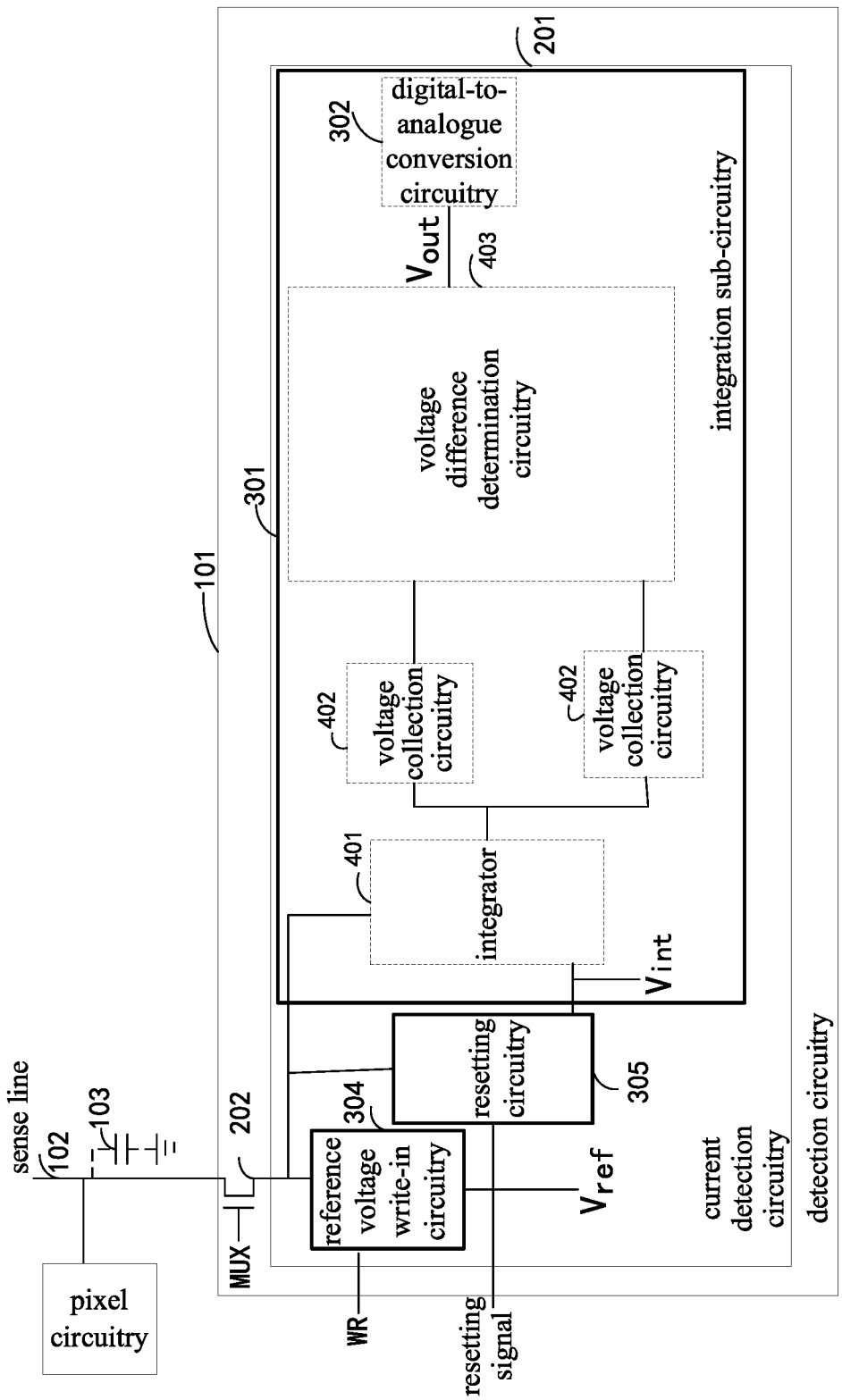
FIG. 4A is a schematic view showing an overall framework of the current detection device according to one embodiment of the present disclosure.
Figure 4B:
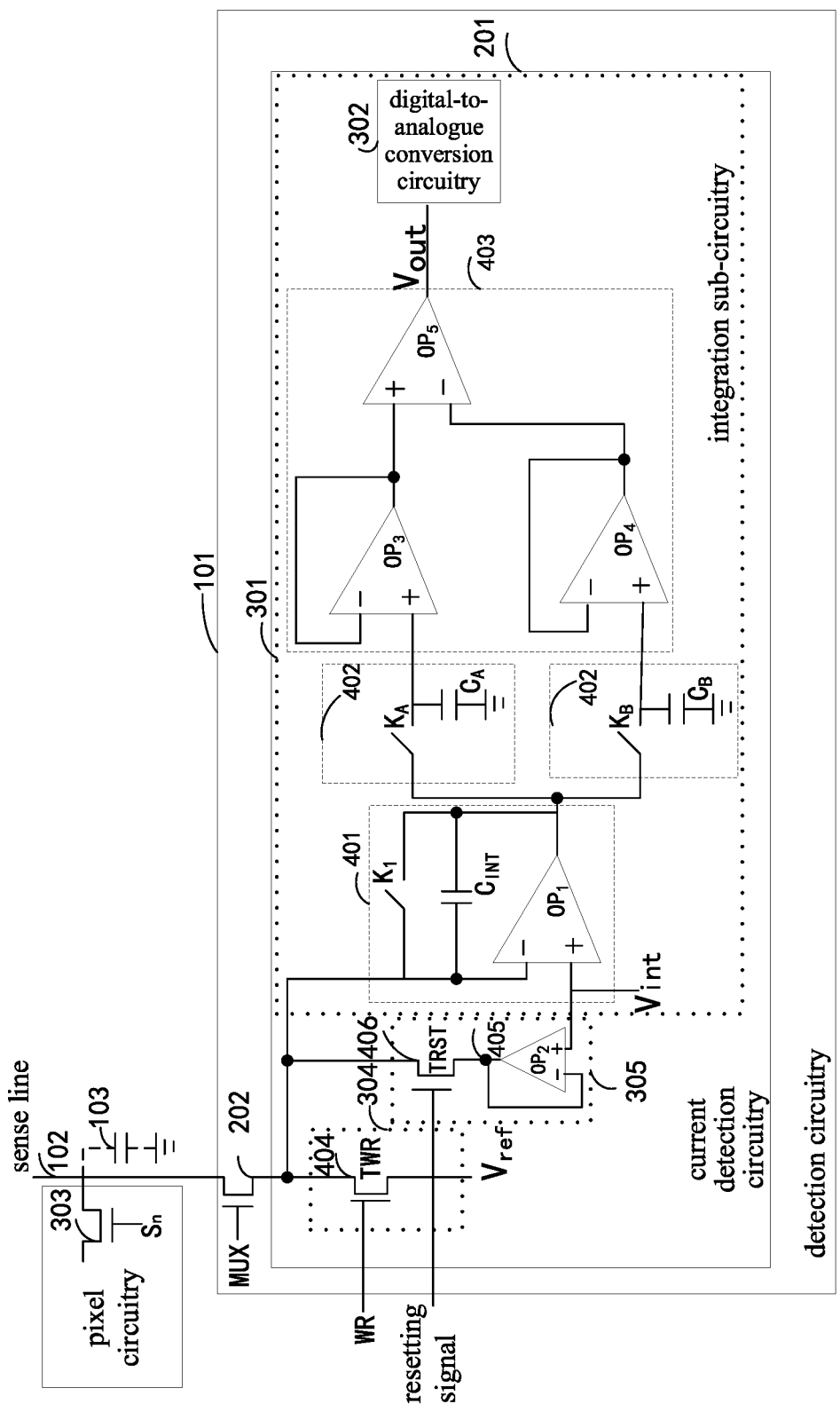
FIG. 4B is a schematic view showing the current detection device according to one embodiment of the present disclosure.

During the implementation, the current detection device includes a plurality of current detection circuitries 201, and each current detection circuitry corresponds to a plurality of sense lines 102. For ease of understanding, a specific structure and a function of the current detection circuitry 201 will be described in details in conjunction with the drawings. Taking one sense line 102, one pixel circuitry and a corresponding current detection circuitry 201 as an example, as shown in FIGS. 4A and 4B, the current detection circuitry 201 includes an integration sub-circuitry 301, a reference voltage write-in circuitry 304 and a resetting circuitry 305. The integration sub-circuitry 301 is configured to perform an integration operation on the current on the sense line 102 to obtain an integrated voltage signal.

At an initial phase of the integration, apart from flowing to the integration sub-circuitry 301, the current on the sense line 102 also needs to charge a parasitic load capacitor 103 on the sense line 102. When the parasitic load capacitor 103 is in a steady state, the current on the sense line 102 flows to the integration sub-circuitry 301 to generate an IR drop. Hence, in the case of a small current, a large current detection error occurs for the sense line 102 at a balance establishment phase of the integration (namely, during the time period within which the parasitic load capacitor 103 is charged).

In some embodiments of the present disclosure, in order to eliminate the error at the balance establishment phase, as shown in FIGS. 4A and 4B, in the embodiments of the present disclosure, the integration sub-circuitry 301 includes an integrator 401, a plurality of voltage collection circuitries 402, a voltage difference determination circuitry 403, and a digital-to-analogue conversion circuitry 302.

One end of the integrator 401 is coupled to the voltage collection circuitry 402, and another end of the integrator 401 is coupled to an initial voltage end $V_{INT}$ and the multiplexer 202. A second end of the integrator 401 is coupled to the multiplexer 202, and a first end thereof is coupled to the initial voltage end $V_{INT}$. The initial voltage end $V_{INT}$ is configured to provide an initial voltage $V_{int}$, and the integrator 401 is configured to perform an integration operation on the current on the sense line 102 to obtain an integrated voltage signal varying over time. As shown in FIG. 4B, the integrator 401 includes an integration control switch $K_1$, an integration capacitor $C_{INT}$, and a low noise operational amplifier $OP_1$ connected in parallel to each other. The low noise operational amplifier $OP_1$ is provided with a first end, a second end and a third end. One end of each of the integration capacitor $C_{INT}$ and the integration control switch $K_1$ is coupled to the second end of the low noise operational amplifier $OP_1$, another end thereof is coupled to the third end of the low noise operational amplifier $OP_1$, and the first end of the low noise operational amplifier $OP_1$ is coupled to the initial voltage end $V_{INT}$. The first end is a positive input end, the second end is a negative input end, and the third end is an output end. Alternatively, the first end is a negative input end, the second end is a positive input end, and the third end is an output end, which will not be particularly defined herein.

The integrator has a resetting function when the integration control switch $K_1$ is turned on, so as to clear charges on the integration capacitor $C_{INT}$. When the integration control switch $K_1$ is turned off, the integrator 401 starts to operate (i.e., to perform the integration operation).

FIGS. 4A and 4B show two voltage collection circuitries. As shown in FIG. 4B, one of the voltage collection circuitries 402 includes a collection switch $K_A$ and a maintenance capacitor $C_A$, and the other voltage collection circuitry 402 includes a collection switch $K_B$ and a maintenance capacitor $C_B$. The voltage collection circuitry 402 is configured to collect a voltage on the integrator 401 at a specified integration time point so as to sample the integrated voltage signal, and save the sampled voltage to the maintenance capacitors $C_A$ and $C_B$. Different voltage collection circuitries 402 have different specified integration time points, namely the maintenance capacitors $C_A$ and $C_B$ store the voltages at different integration time points. In order to collect the voltages at different integration time points, the integration sub-circuitry 301 is provided with a plurality of voltage collection circuitries 402. For ease of understanding, FIGS. 4A and 4B show two voltage collection circuitries 402.

As shown in FIG. 4B, one end of the collection switch $K_A$ is coupled to a high input impedance follower $OP_3$ in the voltage difference determination circuitry 403 and a first end of the maintenance capacitor $C_A$, and another end is coupled to the third end of the integrator 401. One end of the collection switch $K_B$ is coupled to a high input impedance follower $OP_4$ in the voltage difference determination circuitry 403 and a first end of a maintenance capacitor $C_B$, and another end coupled to the third end of the integrator 401.

The first end of each of the maintenance capacitors $C_A$, $C_B$ of the voltage collection circuitry 402 $C_B$ is coupled to a corresponding collection switch $K_A$ or $K_B$, and a second end thereof is coupled to a ground end. As shown in FIG. 4B, the high input impedance followers $OP_3$ and $OP_4$ are configured to sample the integrated voltage signal through the collection switches $K_A$ and $K_B$ respectively, and save the voltages $V_A$ and $V_B$ at different specified integration time points in the maintenance capacitors $C_A$ and $C_B$ respectively.

The voltage difference determination circuitry 403 is configured to calculate an output voltage difference between different sampling points obtained by the plurality of voltage collection circuitries 402, and transmit the output voltage difference to the digital-to-analogue conversion circuitry 302 for digital-to-analogue conversion. As shown in FIG. 4B, the voltage difference determination circuitry 403 includes a plurality of subtractors $OP_5$ (only one is shown in FIG. 4B) and high input impedance followers. The two input ends of each subtractor are coupled to two high input impedance followers respectively, and a third end of the subtractor is coupled to the digital-to-analogue conversion circuitry 302.

One end of each high input impedance follower is coupled to the subtractor, and another end is coupled to the voltage collection circuitry. As shown in FIG. 4B, the two input ends of subtractor $OP_5$ are coupled to high input impedance followers $OP_3$ and $OP_4$, respectively.

Figure 11:
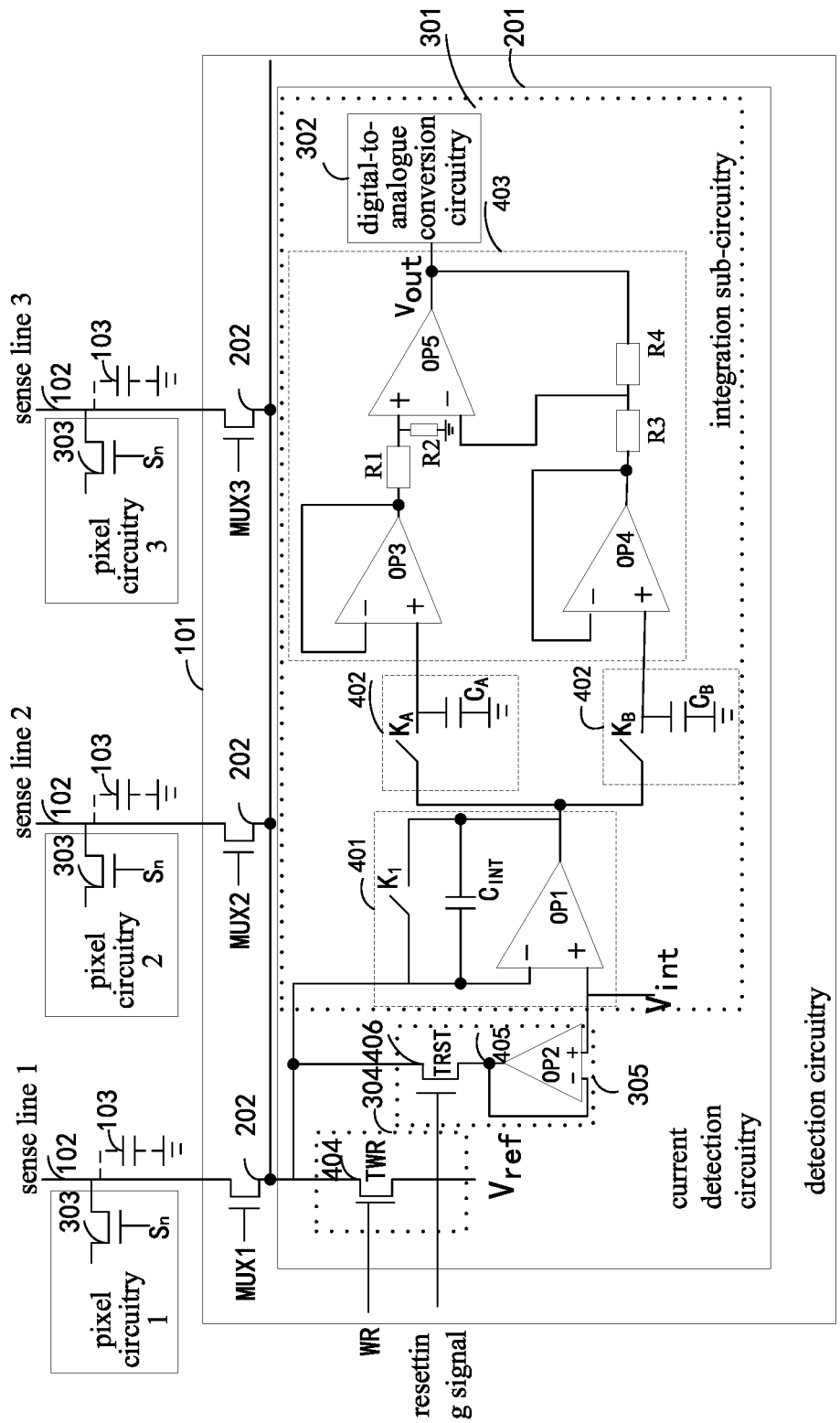
FIG. 11 is a schematic view showing the current detection device according to one embodiment of the present disclosure.

In the embodiments of the present disclosure, in order to flexibly set an amplification factor of the subtractor $OP_5$, a first resistor module and a second resistor module are further provided in the voltage difference determination circuitry 403, as shown in FIG. 11. One end of the first resistor module is coupled to a first end of the subtractor, and another end is coupled to a third end of a high input impedance follower. One end of the second resistor module is coupled to a second end of the subtractor, and another end is coupled to a third end of another high input impedance follower.

In some embodiments of the present disclosure, two resistors are provided in each of the first resistor module and the second resistor module. As shown in FIG. 11, the first resistor module includes a first resistor and a second resistor, one end of the first resistor is coupled to the third end of the high input impedance follower, another end of the first resistor is coupled to the second resistor and the first end of the subtractor, and another end of the second resistor is coupled to the ground end. The second resistor module includes a third resistor and a fourth resistor, one end of the third resistor is coupled to the third end of the high input impedance follower, another end of the third resistor is coupled to the fourth resistor and the second end of the subtractor, and another end of the fourth resistor is coupled to the third end of the subtractor. It should be appreciated that, the quantity of resistors in the first resistor module and the second resistor module will not be particularly defined.

It is assumed that an integrated voltage $V_A$ on the sense line obtained at a first integration time point t is a first integrated voltage, an integrated voltage $V_B$ on the sense line obtained at a second integration time point (t+T) is a second integrated voltage, the first integrated voltage $V_A$ and the second integrated voltage $V_B$ are stored in the maintenance capacitors $C_A$ and $C_B$ respectively, and the first ends of the maintenance capacitors $C_A$ and $C_B$ are coupled to the high input impedance followers $OP_3$ and $OP_4$ respectively. At this time, a voltage difference is obtained by the subtractor $OP_5$ through $V_{out}=V_A-V_B$ (2), where $V_{out}$ represents the output voltage difference between the time point t and the time point t+T. In other words, a change in the integrated voltage within an integration time period T is $V_{out}=V_A-V_B$.

After obtaining the output voltage difference, the output voltage difference $V_{out}$ is converted from an electrical signal into a digital signal. In the embodiments of the present disclosure, the integration sub-circuitry 301 is provided with the digital-to-analogue conversion circuitry 302 so as to output the digital signal to a controller, so that the controller determines the current on the sense line 102 in accordance with the output voltages at different integration time points.

Of course, it should be appreciated that, the quantity of voltage collection circuitries 402 is not limited to two, and in some other embodiments of the present disclosure, the integration sub-circuitry includes a plurality of voltage collection circuitries 402. The voltage collection circuitries sample the integrated voltage signal in sequence to obtain a plurality of sampling points. A sampling point pair is formed through two adjacent sampling points, and a voltage difference between two sampling points in each sampling point pair is determined so as to obtain a plurality of voltage differences. Then, an average of the voltage differences is calculated as the input voltage difference. For example, in the case of four voltage collection circuitries 402, a first voltage collection circuitry 402 saves a voltage at the time point t to the maintenance capacitor $C_A$, a second voltage collection circuitry 402 saves a voltage at the time point (t+T) to the maintenance capacitor $C_B$ when the integration is started, a third voltage collection circuitry 402 saves a voltage at a time point (t+2T) to a maintenance capacitor $C_C$, and a fourth voltage collection circuitry 402 saves a voltage at a time point (t+3T) to a maintenance capacitor $C_D$. A voltage difference between the time point t and the time point (t+T) and a voltage difference between the time point (t+2T) and the time point (t+3T) are calculated, and then an average is obtained as the voltage difference. This is also applicable to more voltage collection circuitries 402. However, it should be appreciated that, T represents a time interval between the sampling points, and values of T may be the same or different, namely, the integrated voltage signal may be sampled at an equal interval, or at different intervals.

In the embodiments of the present disclosure, the sense line 102 is coupled to the sensing control switch 303 in the pixel circuitry as shown in FIG. 4B. One end of the sensing control switch 303 is coupled to the corresponding sense line 102, and another end thereof is coupled to the pixel circuitry as shown in FIG. 1A (only the sensing control switch 303 is shown in FIG. 4B). The function of the sensing control switch 303 has been described hereinabove, and thus will not be particularly defined herein.

As shown in FIG. 4B, one end of the reference voltage write-in circuitry 304 is coupled to the multiplexer 202 and another end thereof is coupled to a reference voltage end $V_{REF}$ for providing a reference voltage $V_{ref}$. The reference voltage write-in circuitry 304 includes a reference level control switch 404, a gate electrode of which is coupled to a control level WR. As shown in FIG. 4B, the reference voltage write-in circuitry 304 is configured to write the reference voltage $V_{ref}$ into one end of the storage capacitor $C_{st}$ (e.g., $C_{st}$ in FIG. 1A) of the pixel circuitry through the multiplexer 202, the sense line 102, and the sensing control switch 303.

In some embodiments of the present disclosure, a data write-in phase will be described when the reference level control switch 404 is a TWR transistor. The TWR transistor is manufactured easily through a same process as the other transistors (such as the driving transistor $T_1$, the first switching transistor $T_2$ and the sensing control switch $T_3$ in FIG. 1A) and the control switch (such as the multiplexer 202). When data is written into a gate electrode and a source electrode of the driving transistor $T_1$ in the pixel circuitry, the reference voltage $V_{ref}$ is at a high level, so the sensing control switch 303 and the reference level control switch 404 (the TWR transistor) are turned on. The reference voltage end $V_{REF}$ writes the reference voltage $V_{ref}$ into the source electrode of the driving transistor $T_1$ through the reference level control switch 404 (the TWR transistor), the sense line 102 and the sensing control switch 303. When the $V_{ref}$ is at a high level, the first switching transistor $T_2$ is controlled to be turned on, and the grayscale voltage $V_{data}$ on the pixel circuitry is written into the gate electrode of the driving transistor $T_1$. Hence, a gate-to-source voltage of the driving transistor $T_1$ at the data write-in phase is calculated through $V_{GS}=V_{data}-V_{ref}$ (3), and the driving transistor $T_1$ outputs a constant current $$I_{T1} = \frac{1}{2}\mu C_{OX}\frac{W}{L}(V_{data} - V_{ref} - V_{TH})^2.$$

As shown in FIG. 4B, one end of the resetting circuitry 305 is coupled to the multiplexer 202, and another end thereof is coupled to the initial voltage end $V_{INT}$ and the low noise operational amplifier $OP_1$. The resetting circuitry 305 is configured to reset the voltage on the sense line 102, i.e., reset the voltage on the sense line 102 to the initial voltage $V_{int}$. The resetting circuitry 305 includes a follower amplifier 405 and a resetting control switch 406.

One end of the follower amplifier (e.g., $OP_2$ in FIG. 4B) 405 is coupled to the resetting control switch 406, and another end thereof is coupled to the initial voltage end $V_{INT}$. The follower amplifier 405 is configured to reset the voltage on the sense line 102 to the initial voltage $V_{int}$ when the resetting control switch 406 is in an on state.

In some embodiments of the present disclosure, the resetting control switch 406 is a TRST transistor, and the TRST transistor is manufactured easily through a same process as the other transistors and control switches. One end of the resetting control switch 406 (TRST transistor) is coupled to a corresponding multiplexer 202 on the plurality of sense lines 102, and another end thereof is coupled to the follower amplifier 405. The resetting circuitry 305 is configured to reset the voltage on the sense line 102 to the initial voltage $V_{int}$ before the integration operation performed by the integrator 401, so as to reduce a duration of the balance establishment phase.

Figure 4C:
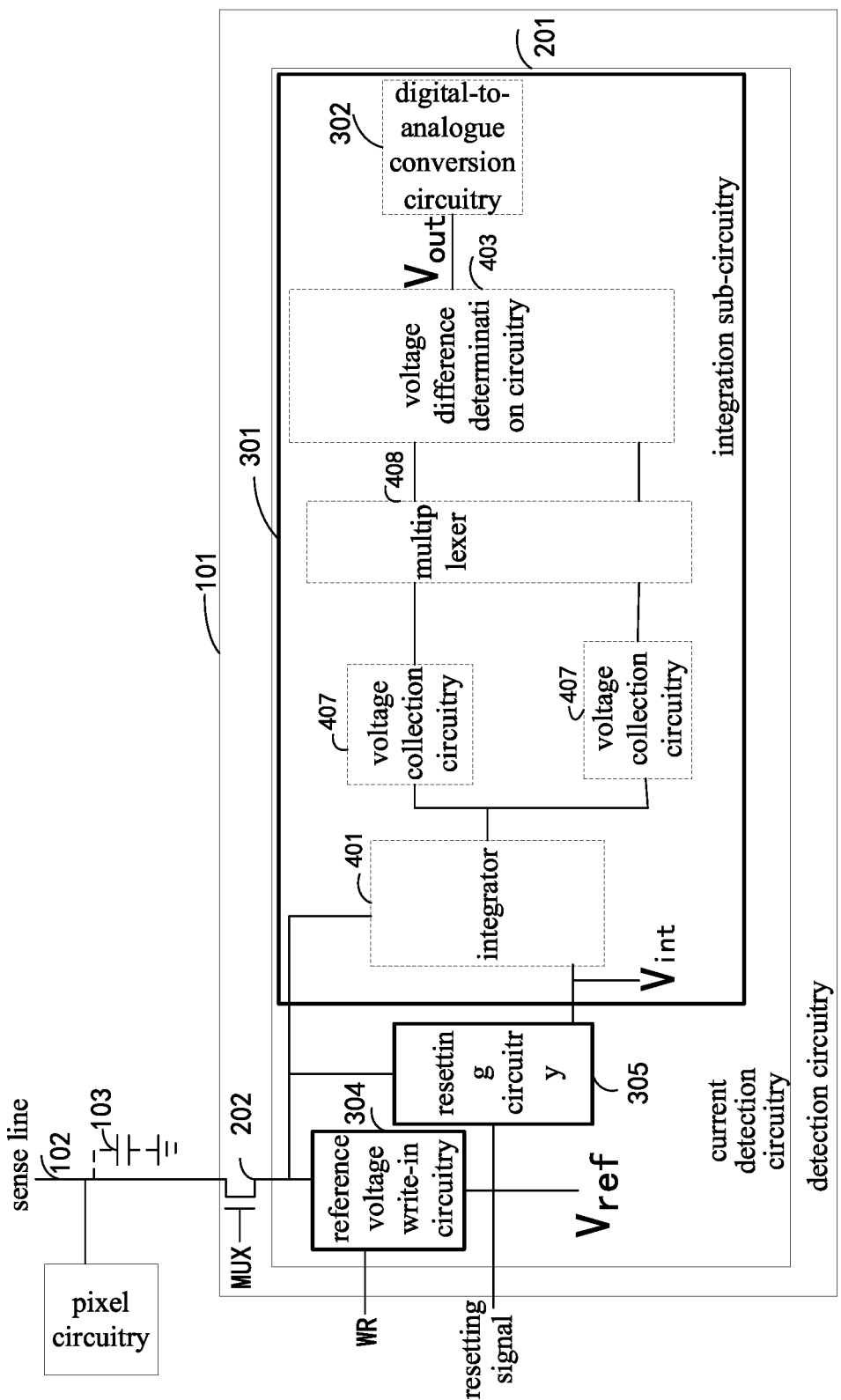
FIG. 4C is another schematic view showing the overall framework of the current detection device according to one embodiment of the present disclosure.

In some embodiments of the present disclosure, in order to improve the detection efficiency, the integration sub-circuitry 301 in FIG. 4B may be replaced with the integration sub-circuitry 301 in FIG. 4C. It should be appreciated that, the operations at the data write-in phase and the resetting phase in FIG. 4A are identical to those in FIG. 4C, with the only difference in the structures and operation principles of the integration sub-circuitry 301. The operation efficiency of the integration sub-circuitry 301 in FIG. 4C is higher than that in FIG. 4B. As shown in FIG. 4C, the integration sub-circuitry includes an integrator 401, a plurality of voltage collection circuitries 407, a multiplexer 408 and a digital-to-analogue conversion circuitry 302, and the plurality of voltage collection circuitries 407 includes at least two groups of voltage collection circuitries 407.

Figure 4D:
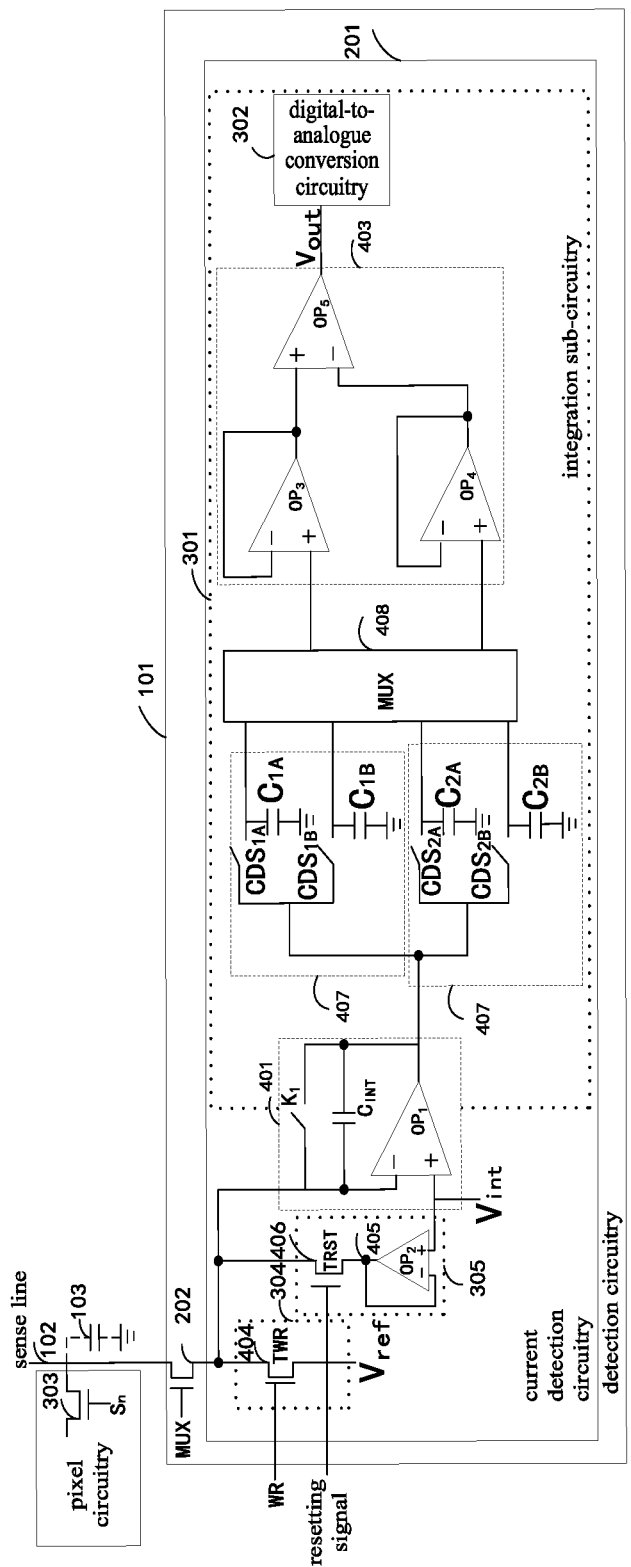
FIG. 4D is a schematic view showing the current detection according to one embodiment of the present disclosure.

As shown in FIGS. 4C and 4D, the integrator 401 is configured to perform an integration operation on the current on the sense line 102 to obtain an integrated voltage signal varying over time. One group of voltage collection circuitries in the at least two groups of voltage collection circuitries 407 are configured to sample the integrated voltage signal on the sense line 102 for multiple times to obtain a plurality of sampling points, and save the plurality of sampling points. The remaining groups of voltage collection circuitries 407 are configured to sample an integrated voltage signal on the other sense line 102 for multiple times to obtain a plurality of sampling points when current detection is performed on the other sense line 102, and save the plurality of sampling points.

In some embodiments of the present disclosure, for ease of description, as shown in FIGS. 4C and 4D, the plurality of groups of voltage collection circuitries includes a first group of voltage collection circuitries and a second group of voltage collection circuitries. One group of voltage collection circuitries in the first group of voltage collection circuitries and the second group of voltage collection circuitries are configured to sample the integrated voltage signal on the sense line for multiple times to obtain a plurality of sampling points, and save the plurality of sampling points. The other group of voltage collection circuitries are configured to sample the integrated voltage signal on a next sense line for multiple times to obtain a plurality of sampling points when the current detection is performed on the next sense line, and save the plurality of sampling points. For example, the operations at the data write-in phase are the same as those at the resetting phase, and when the current on the sense line 1 is detected by the integration sub-circuitry 301 in FIG. 4C, the sensing control switch 303, the multiplexer 202 and the resetting switch $K_1$ are in an on state at a capacitance balance phase after the data write-in phase and the resetting phase. The first group of voltage collection circuitries are used to sample the integrated voltage signal on the sense line 1 for multiple times to obtain and save a plurality of sampling points at a sampling phase after the capacitance balance phase. Then, the multiplexer 202 for the sense line 1 is turned off, and the multiplexer for a sense line 2 is turned on, so as to detect the current on the sense line 2. To be specific, the second group of voltage collection circuitries are used to sample the integrated voltage signal on the sense line 2 for multiple times to obtain and save a plurality of sampling points after the capacitance balance phase. In addition, the digital-to-analogue conversion circuitry 302 is controlled to perform digital-to-analogue conversion on the sampling points for the sense line 1 saved in the first group of voltage collection circuitries.

In some embodiments of the present disclosure, as shown in FIG. 4D, the voltage collection circuitry 407 includes a collection switch and a maintenance capacitor. One end of the collection switch is coupled to an output end of the integrator, and another end thereof is coupled to the first end of the maintenance capacitor and the multiplexer 408. As shown in FIG. 4C, a compact digital switch (CDS) is used as a collection switch, the first end of the maintenance capacitor is coupled to the collection switch, and the second end of the maintenance capacitor is coupled to the ground end.

As shown in FIG. 4D, one end of the multiplexer 408 is coupled to a plurality of voltage collection circuitries 407, and another end thereof is coupled to the digital-to-analogue conversion circuitry 302. The multiplexer 408 is configured to enable a group of voltage collection circuitries which save the sampling points for the sense line at a specified occasion when current detection is performed by the current detection circuitry 201 on a next sense line. In some embodiments of the present disclosure, the specified occasion is before the sampling of an integrated voltage signal on the next sense line 102 by the integration sub-circuitry 301 and after the multiplexer 202 corresponding to the sense line 102 is in the on state. During the implementation, a time period within which the digital-to-analogue conversion on the sampling points for a current sense line does not overlap with a time period within which the integrated voltage signal on the next sense line is sampled. In some embodiments of the present disclosure, the multiplexer 408 is manufactured easily through a same process as the multiplexer 202.

Figure 13:
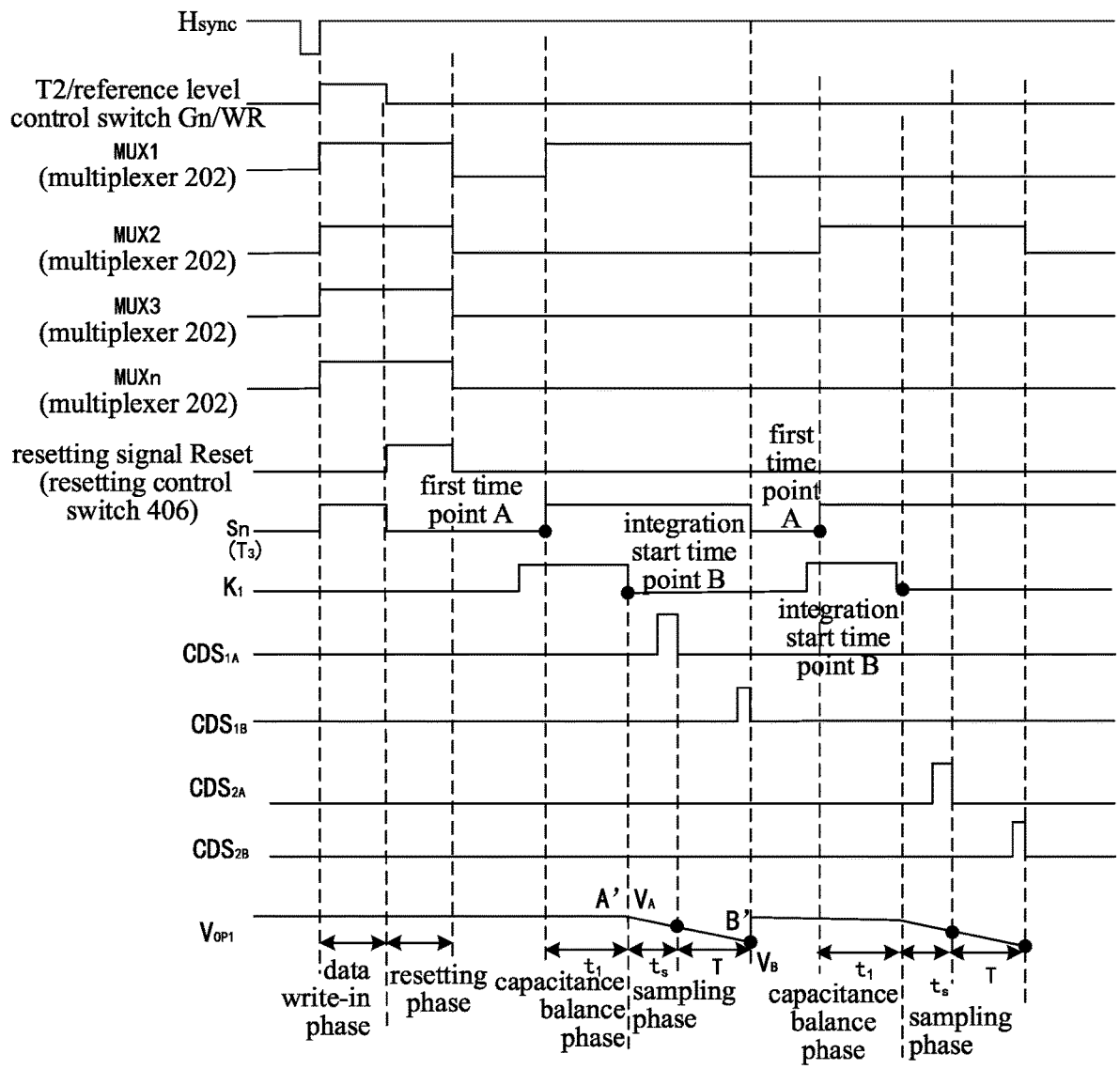
FIG. 13 is another sequence diagram of the current detection device according to one embodiment of the present disclosure.

For example, the operations at the data write-in phase are the same as those at the resetting phase. As shown in FIG. 13, when the current on an $n^{th}$ sense line is detected, the multiplexer $MUX_n$ 202 corresponding to the $n^{th}$ sense line and the sensing control switch 303 in the corresponding pixel circuitry are turned on. At the sampling phase, the collection switches $CDS_{1A}$ and $CDS_{1B}$ are turned on at different integration time points, and the obtained voltages are stored in the maintenance capacitors $C_{1A}$ and $C_{1B}$ respectively. When the current on an $(n+1)^{th}$ sense line is detected, the multiplexer $MUX_n$ 202 corresponding to the $n^{th}$ sense line is turned off, and the multiplexer $MUX_{n+1}$ 202 corresponding to the $(n+1)^{th}$ sense line and the sensing control switch 303 in the corresponding pixel circuitry are turned on. At any phase before the sampling phase for the $(n+1)^{th}$ sense line, the multiplexer 408 MUX is used to select the collection switches $CDS_{1A}$ and $CDS_{1B}$, so as to apply the voltages on the maintenance capacitors $C_{1A}$ and $C_{1B}$ to the voltage difference determination circuitry.

Figure 4E:
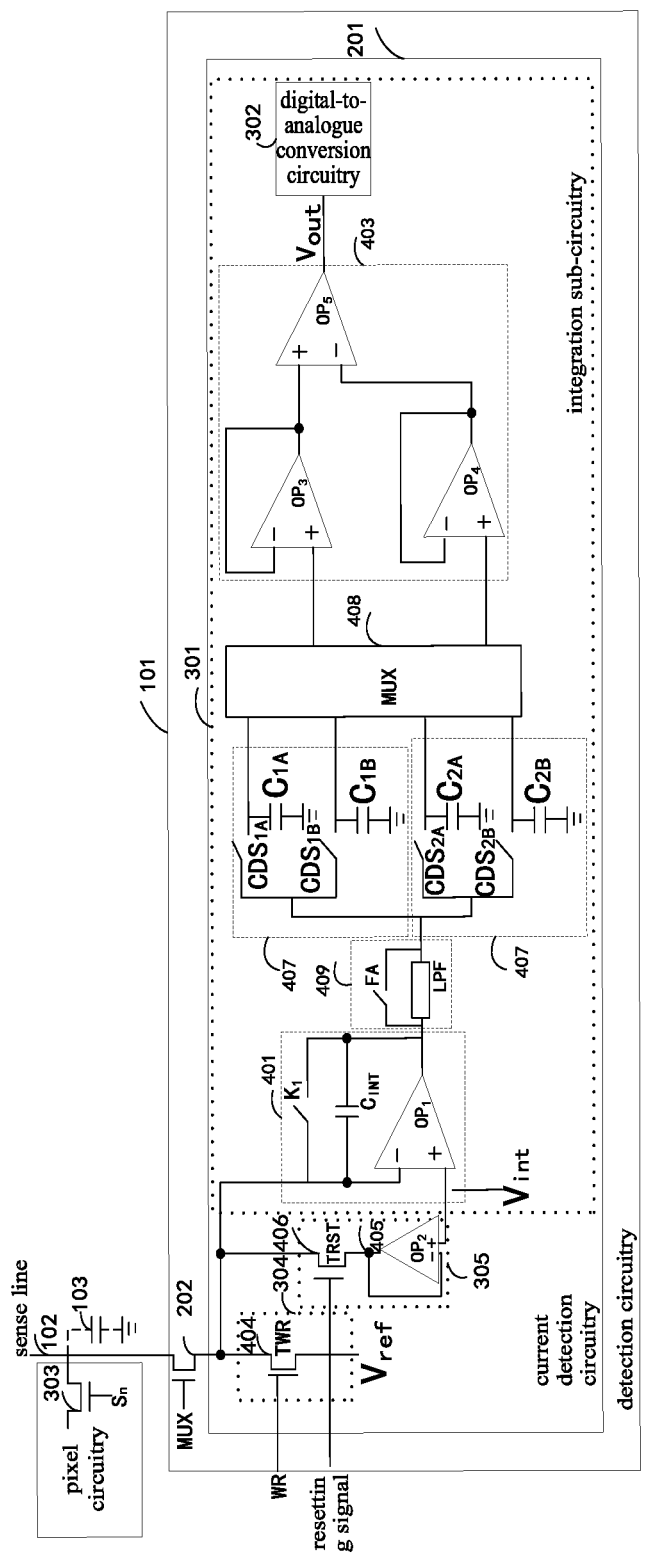
FIG. 4E is another schematic view showing the current detection device according to one embodiment of the present disclosure.
Figure 4F:
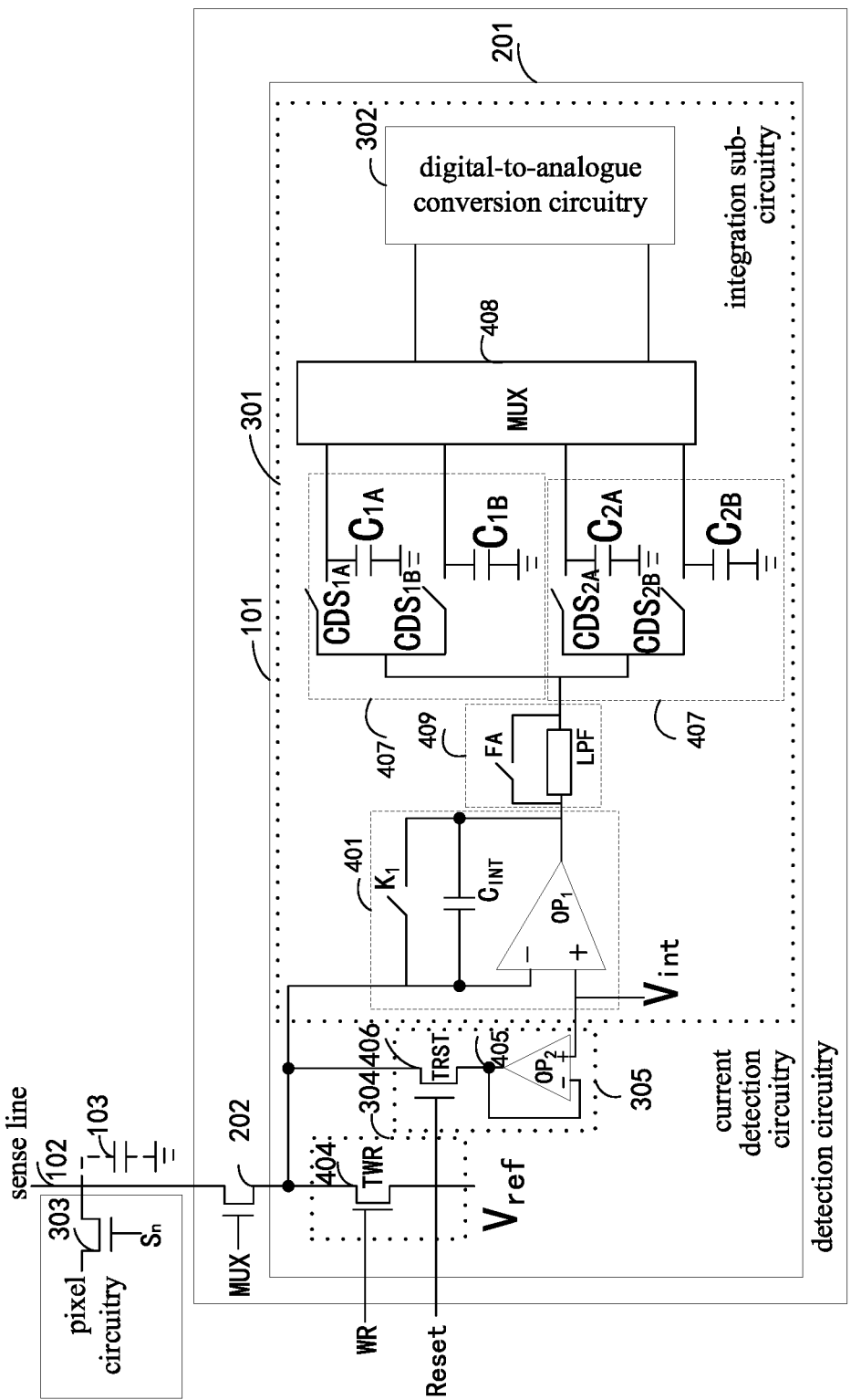
FIG. 4F is yet another schematic view showing the current detection device according to one embodiment of the present disclosure.

In the embodiments of the present disclosure, as shown in FIG. 4F, in order to control parameters of electronic elements in the integration sub-circuitry 301 conveniently, a protection circuitry 409 is arranged between the integrator 401 and the voltage collection circuitry 40. The protection circuitry 409 includes a resistor module and a control switch connected in parallel to each other. The control switch is a factory auto (FA), and the resistor module is a low pass filter (LPF). When the parameters of the electronic elements in the integration sub-circuitry 301 need to be adjusted, a resistance value of the resistor module LPF is adjusted. The control switch FA needs to be turned on before the sampling phase when the current detection is performed on the sense line 102.

In some embodiments of the present disclosure, the voltage is directly calculated by the digital-to-analogue conversion circuitry 302 so as to obtain the voltage difference. Hence, as shown in FIG. 4E, no voltage difference determination circuitry is provided in the current detection device. When the current on the $n^{th}$ sense line is detected, at the sampling phase, the sampling control switches $CDS_{1A}$ and $CDS_{1B}$ are turned on at different integration time points, and the obtained voltages are stored in storage capacitors $C_{1A}$ and $C_{1B}$ respectively. When the current on the $(n+1)^{th}$ sense line is detected, before the sampling phase, the multiplexer 202 selects the sampling control switches $CDS_{1A}$ and $CDS_{1B}$, so as to apply the voltages in the storage capacitors $C_{1A}$ and $C_{1B}$ to the digital-to-analogue conversion circuitry 302 through the multiplexer 202 for digital-to-analogue conversion. In addition, the sampling control switches $CDS_{2A}$ and $CDS_{2B}$ are turned on at different integration time points, and the obtained voltages are stored in the storage capacitors $C_{2A}$ and $C_{2B}$ respectively.

The current detection device has been described hereinabove, and a current detection method for the current detection device will be described hereinafter in details in conjunction with the drawings.

The current detection method in the embodiments of the present disclosure includes a data write-in phase at which the grayscale voltage $V_{data}$ on the pixel circuitry in FIG. 1A is written into the driving transistor $T_1$, a resetting phase at which the voltage on the sense line 102 is reset from the reference voltage $V_{ref}$ to the initial voltage $V_{int}$, an integration phase at which an integration operation is performed on the sense line 102, and a calculation phase at which the current on the sense line 102 is determined in accordance with the output voltage, which will be described hereinafter.

Figure 5A:
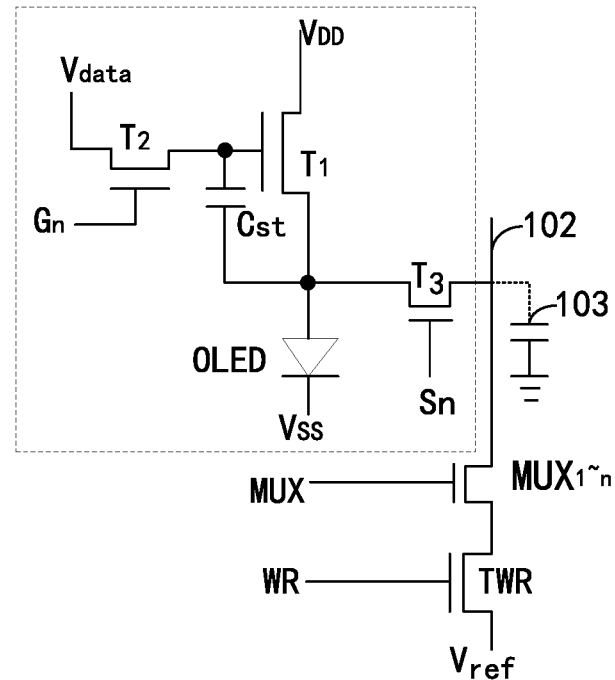
FIG. 5A is a circuit diagram of the current detection device at a data write-phase according to one embodiment of the present disclosure.
Figure 5B:
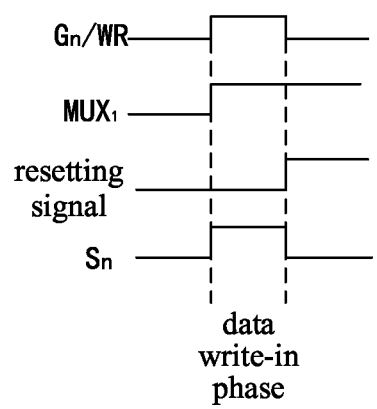
FIG. 5B is a sequence diagram of the current detection device at the data write-in phase according to one embodiment of the present disclosure.

As shown in FIGS. 5A and 5B, at the data write-in phase, a gate electrode level $G_n$ (namely, $G_n$ in FIG. 1A) of the first switching transistor $T_2$, a gate electrode control level Sn (namely, Sn in FIG. 1A) of the sensing control switch 303 ($T_3$), a gate control signal MUX of the multiplexers 202 ($MUX_{1-n}$) and a gate electrode control level WR of the reference level control switch 404 (TWR) are all a high level (as shown in FIG. 5B). At this time, the first switching transistor $T_2$, the reference level control switch 404 (TWR), the sensing control switch 303 ($T_3$) and the multiplexers 202 ($MUX_{1-n}$) of the pixel circuitry (indicated by a dotted box in FIG. 5A) are in an on state.

As shown in FIG. 5A, the grayscale voltage $V_{data}$ on the pixel circuitry is written into a gate electrode G of the driving transistor $T_1$ through the first switching transistor $T_2$, and the reference voltage $V_{ref}$ is written into a source electrode S of the driving transistor $T_1$ through reference level control switch 404 (TWR), the sense line 102 and the sensing control switch 303 ($T_3$). At this time, a gate-to-source voltage of $T_1$ is calculated through $V_{GS}=V_{data}-V_{ref}$ (4), where $V_{GS}$ is the gate-to-source voltage of $T_1$, $V_{data}$ is the grayscale voltage on the pixel circuitry, and $V_{ref}$ is the reference voltage. In addition, the reference voltage $V_{ref}$ is stored in the storage capacitor $C_{st}$ of the pixel circuitry.

After the first switching transistor $T_2$ is in an off state, under the effect of the voltage on the storage capacitor $C_{st}$, an output current of the driving transistor $T_1$ is calculated through $$I_{T1} = \frac{1}{2}\mu C_{OX}\frac{W}{L}(V_{data} - V_{ref} - V_{TH})^2, \qquad (5)$$

where $I_{T1}$ is the output current of the driving transistor $T_1$, µ represents the mobility, Cox represents a capacitance of a gate oxide layer, W represents a width of a channel of the driving transistor $T_1$, L represents a length of the channel of the driving transistor $T_1$, $V_{TH}$ represents a threshold voltage of the driving transistor $T_1$, $V_{data}$ represents a grayscale voltage on the pixel circuitry, and $V_{ref}$ represents the reference voltage.

Figure 6A:
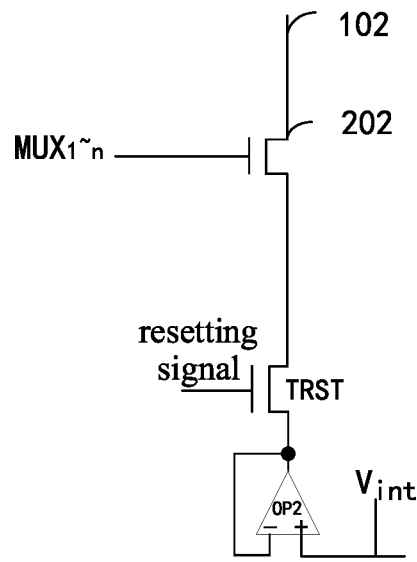
FIG. 6A is a circuit diagram of the current detection device at a resetting phase according to one embodiment of the present disclosure.
Figure 6B:
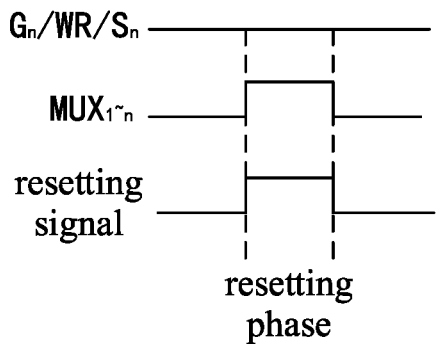
FIG. 6B is a sequence diagram of the current detection device at the resetting phase according to one embodiment of the present disclosure.

As shown in FIGS. 6A and 6B, the voltages on the reference level control switch 404 (TWR in FIG. 6A) and the sense line 102 at the data write-in phase are the reference voltage $V_{ref}$. The voltage on the sense line 102 needs to be the initial voltage $V_{int}$ when the low-noise operational amplifier $OP_1$ (not shown in FIG. 6A) in the integrator 401 performs the integration operation, so the voltage on the sense line 102 needs to be reset from the reference voltage $V_{ref}$ to the initial voltage $V_{int}$ in advance by the resetting circuitry 305 (TRST).

During the resetting, the gate electrode level $G_n$ of the first switching transistor $T_2$, the gate electrode control level Sn of the sensing control switch 303 and the gate electrode control level WR signal of the reference level control switch 404 are low levels (as shown in FIG. 6B), and the multiplexer 202 and the resetting signal (Reset) are high levels, so the multiplexer 202 and the resetting control switch 406 (TRST) are in an on state. The sense line 102 is charged by the initial voltage $V_{int}$ through the follower amplifier $OP_2$, the resetting control switch 406 (TRST) and the multiplexer 202, so as to reset the level of the sense line 102 from the reference voltage $V_{ref}$ at the data write-in phase to the initial voltage $V_{int}$.

As shown in FIGS. 4B and 4D, when the integration control switch $K_1$ of the integrator 401 is in an on state, the third end and the second end of the low noise operational amplifier $OP_1$ are short-circuited, the integration capacitor $C_{INT}$ is short-circuited, and charges on the integration capacitor $C_{INT}$ are reset to 0. In addition, the operation state of the low noise operational amplifier $OP_1$ is an operation state of the follower, and the voltage at the third end of the low noise operational amplifier $OP_1$ is the initial voltage $V_{int}$ at the second end.

Due to a junction capacitor at the sensing control switch 303 ($T_3$) of the pixel circuitry, when the gate electrode control level Sn of the sensing control switch 303 rises from a low level to a high level, charges on the junction capacitor are released to the sense line 102, so a voltage jump occurs for the output of the integration sub-circuitry 301.

Figure 9:
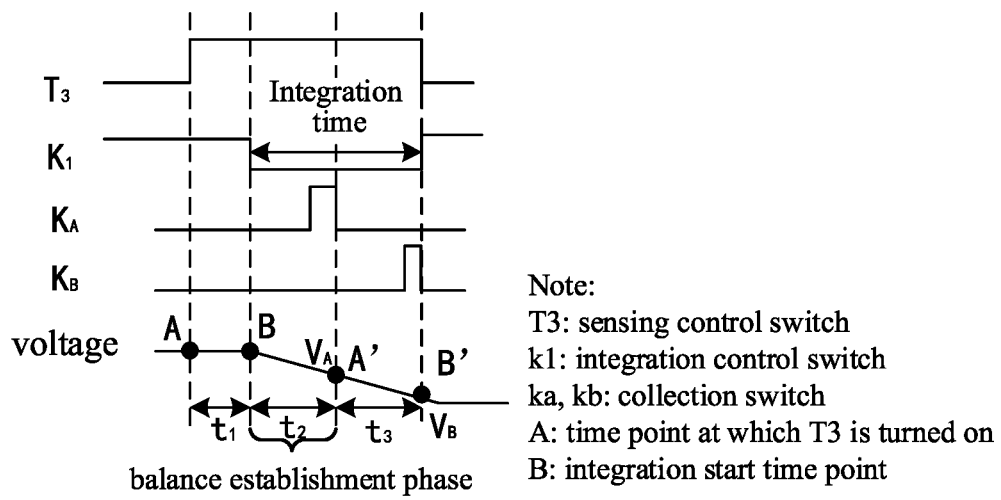
FIG. 9 is a sequence diagram of the current detection device when a sensing control switch is turned on at a time point $t_1$ prior to an integration operation according to one embodiment of the present disclosure.

Hence, as shown in FIGS. 4B, 4D and 9, the integration control switch $K_1$ needs to be in an on state before the integration operation of the integration sub-circuitry 301, so as to reset the junction capacitor at the sensing control switch 303, the sense line 102, the junction capacitor at the multiplexer 202 to the initial voltage $V_{int}$. A resetting time period is from a time period when the sensing control switch 303 is turned on to a time point when the integration control switch $K_1$ is turned on, and it is marked as $t_1$. It should be appreciated that, $t_1$ is determined by a person skilled in the art according to the experience, and $t_1$ is related to parameters such as a junction capacitance at the sensing control switch 303 and a junction capacitance at the multiplexer 202.

Figure 12:
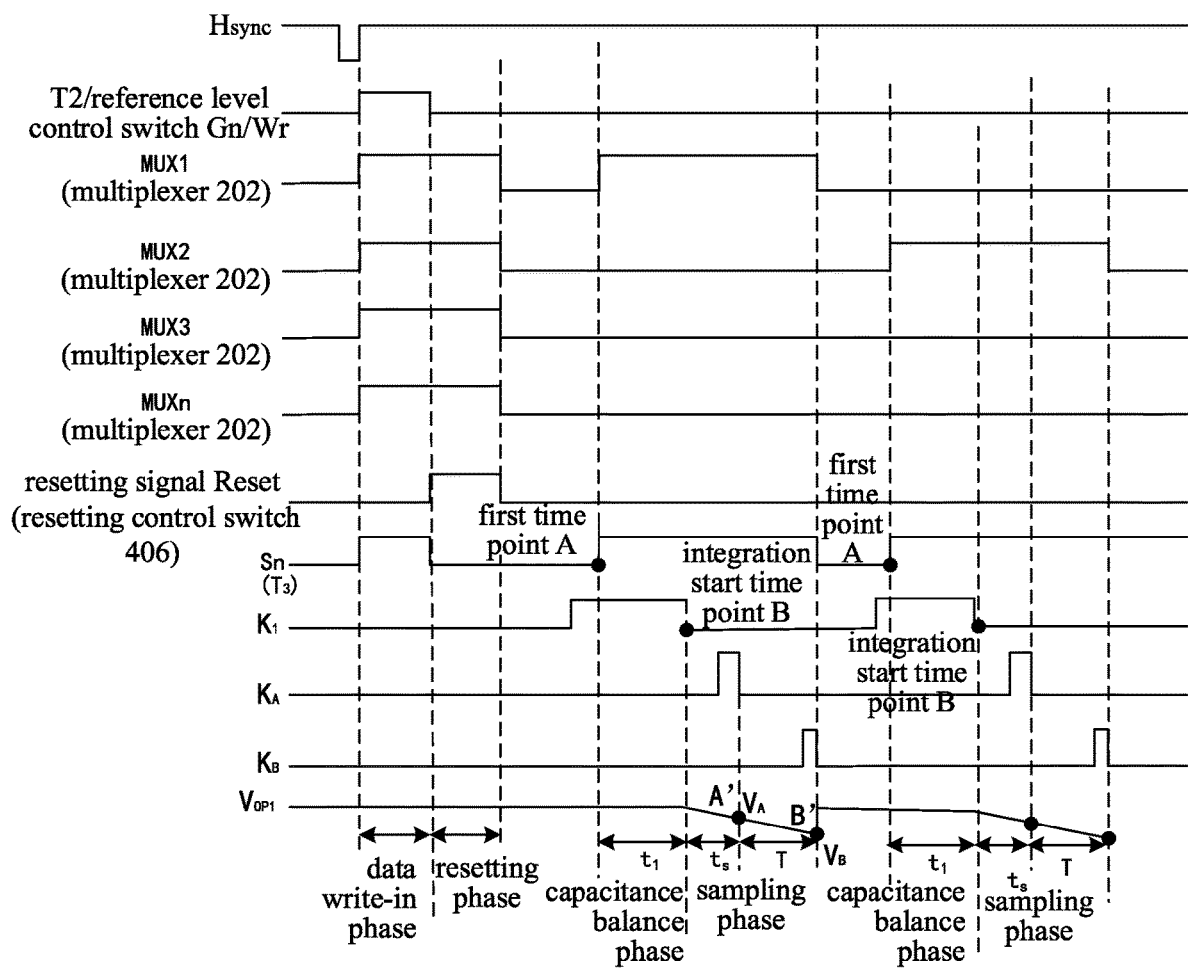
FIG. 12 is a sequence diagram of the current detection device according to one embodiment of the present disclosure.

The sampling phase will be described hereinafter on the basis of FIGS. 4B and 12. At an integration start time point B, the integration control switch $K_1$ is turned off, the low noise operational amplifier $OP_1$ in the integrator 401 is in an open-loop integration state, and the multiplexer 202 (at a high level as shown in FIG. 12) and the sensing control switch 303 (at a high level as shown in FIG. 12) are turned on, so under the effect of the voltage on the storage capacitor $C_{st}$, the driving current outputted by the driving transistor $T_1$ flows through the sensing control switch 303, the sense line 102 and the multiplexer 202 (MUX) to the integration capacitor $C_{INT}$. As shown in FIG. 12, an output voltage $V_{OP1}$ of the integrator decreases along with time when $K_1$ is switched from an on state to an off state. After $t_s$, the output voltage $V_{OP1}$ of the integrator drops from $V_{int}$ to $V_A$, and $K_A$ of the voltage collection circuitry 402 is turned on to collect the voltage $V_A$ and store it in the capacitor $C_A$. After T, the integrated voltage drops from $V_A$ to $V_B$, and $K_B$ of the voltage collection circuitry 402 is turned on, so as to collect the voltage $V_B$ and store it in the capacitor $C_B$.

After $V_A$ and $V_B$ have been stored in the capacitors $C_A$ and $C_B$ respectively, the voltage difference $V_{out}$ (i.e., the voltage difference between $V_A$ and $V_B$) obtained through the high input impedance followers $OP_3$ and $OP_4$ and the subtractor $OP_5$ is calculated through $V_{out}=V_A-V_B$ (6a).

As shown in FIG. 4B, upon the receipt of the output voltage, i.e., the voltage difference $V_{out}$, the digital-to-analogue conversion circuitry 302 converts $V_{out}$ from an electrical signal into a digital signal and outputs it to a controller (not shown). The controller calculates an average current within a time period T in accordance with the capacitors $C_A$ and $C_B$ and the output voltage $V_{out}$ (the voltage difference between $V_A$ and $V_B$ within a time interval T from the time point $t_s$ to the time point ($t_s$+T)) through $$I_{T1} = \frac{C_{INT}}{T} \times (V_A - V_B), \quad (7a)$$

where $I_{T1}$ is the average current within the time period T, $C_{INT}$ represents an integration capacitance, $V_A$ represents a voltage collected by the voltage collection circuitry 402 at the time point $t_s$ and stored in the capacitor $C_A$, $V_B$ represents a voltage collected by the voltage collection circuitry 402 at the time point ($t_s$+T) and stored in the capacitor $C_B$, and T represents the time interval between two voltage collection operations performed by the voltage collection circuitry.

In addition, as shown in FIG. 13, the data write-in phase, the resetting phase and the capacitance balance phase are the same as those in FIG. 12, and thus will not be particularly defined herein. The sampling stage in FIG. 13 will be described hereinafter in conjunction with the circuit diagram in FIG. 4D.

At the integration start time point B, the integration control switch $K_1$ is turned off, and the low noise operational amplifier $OP_1$ in the integrator 401 is in an open-loop integration state, so the multiplexer 202 (at a high level in FIG. 13) and the sensing control switch 303 (at a high level in FIG. 13) are turned on. Under the effect of the voltage stored in the storage capacitor $C_{st}$, the driving current outputted by the driving transistor $T_1$ flows through the sensing control switch 303, the sense line 102 and the multiplexer 202 (MUX) to the integration capacitor $C_{INT}$. As shown in FIG. 13, when $K_1$ is switched from an on state to an off state, the output voltage $V_{OP1}$ of the integrator decreases along with time. After $t_s$, the output voltage $V_{OP1}$ of the integrator decreases from $V_{int}$ to $V_{1A}$, and the $CDS_{1A}$ of the voltage collection circuitry 407 is turned on to sample the voltage $V_{1A}$ and store it in the maintenance capacitor $C_{1A}$. After T, the integrated voltage drops from $V_{1A}$ to $V_{1B}$, and the $CDS_{1B}$ of the voltage collection circuitry 407 is turned on, so as to collect the voltage $V_{1B}$ and store it in the maintenance capacitor $C_{1B}$.

After $V_{1A}$ and $V_{1B}$ have been stored in the maintenance capacitors $C_{1A}$ and $C_{1B}$ respectively, the voltage difference $V_{out}$ (i.e., the voltage difference between $V_A$ and $V_B$) obtained through the high input impedance followers $OP_3$ and $OP_4$ and the subtractor $OP_5$ is calculated through $V_{out}=V_{1A}-V_{1B}$ (6b).

When the current on the next sense line is detected, as shown in FIG. 4D, upon the receipt of the output voltage, namely, the voltage difference $V_{out}$, the digital-to-analogue conversion circuitry 302 converts $V_{out}$ from an electrical signal into a digital signal and outputs it to a controller (not shown). The controller calculates an average current within the time period T in accordance with the capacitors $C_{1A}$ and $C_{1B}$ and the output voltage $V_{out}$ (a voltage difference between $V_{1A}$ and $V_{1B}$ within the time interval T from the time point $t_s$ to the time point $t_s$+T) through $$I_{T1} = \frac{C_{INT}}{T} \times (V_{1A} - V_{1B}), \quad (6c)$$

where $I_{T1}$ is the average current within the time period T, $C_{INT}$ represents an integration capacitance, $V_{1A}$ represents a voltage collected by the voltage collection circuitry 402 at the time point $t_s$ and stored in the capacitor $C_{1A}$, $V_{1B}$ represents a voltage collected by the voltage collection circuitry 402 at the time point $t_s$+T and stored in the capacitor $C_{1B}$, and T represents the time interval between two voltage collection operations performed by the voltage collection circuitry. After storing the plurality of sampling points of the integrated voltage signal on the sense line 1, the multiplexer 202 between the sense line 1 and the current detection circuitry is turned off, and the multiplexer 202 between the sense line 2 and the current detection circuitry is turned on. The capacitance balance phase is started before the integration start time point B, and after the capacitance balance phase, the output voltage $V_{OP1}$ of the integrator decreases along with time when $K_1$ is switched from an on state to an off state. After $t_s$, the output voltage $V_{OP1}$ of the integrator decreases from $V_{int}$ to $V_{2A}$, and the $CDS_{2A}$ of the voltage collection circuitry 407 is turned on to sample the voltage $V_{2A}$ and store it in the maintenance capacitor $C_{2A}$. After T, the integrated voltage drops from $V_{2A}$ to $V_{2B}$, and the $CDS_{2B}$ of the voltage collection circuitry 407 is turned on so as to sample the voltage $V_{2B}$ and store it in the maintenance capacitor $C_{2B}$. After $V_{2A}$ and $V_{2B}$ have been stored in maintenance capacitors $C_{2A}$ and $C_{2B}$ respectively, the voltage difference $V_{out}$ (i.e., the voltage difference between $V_A$ and $V_B$) obtained through the high input impedance followers $OP_3$ and $OP_4$ and the subtractor $OP_5$ is calculated through $V_{out}=V_{2A}-V_{2B}$ (6d).

In some embodiments of the present disclosure, the voltage collection circuitry 402 collects the voltages at the time point t, the time point (t+T), a time point (t+2T) and a time point (t+3T), and the controller (not shown) calculates the voltage difference between the time point t and the time point (t+T) and the voltage difference between the time point (t+2T) and the time point (t+3T) in accordance with the maintenance capacitances $C_A$, $C_B$, $C_C$ and $C_D$ (not shown) at the time point t, the time point (t+T), the time point (t+2T) and the time point (t+3T), and then calculates the average current $I_{T1}$ in accordance with the voltage difference between the time point t and the time point (t+T) and the voltage difference between the time point (t+2T) and the time point (t+3T) through $$I_{T1} = \left[\frac{C_{INT}}{T} \times (V_A - V_B) + \frac{C_{INT}}{T} \times (V_C - V_D)\right]/2. \tag{7b}$$

Figure 7:
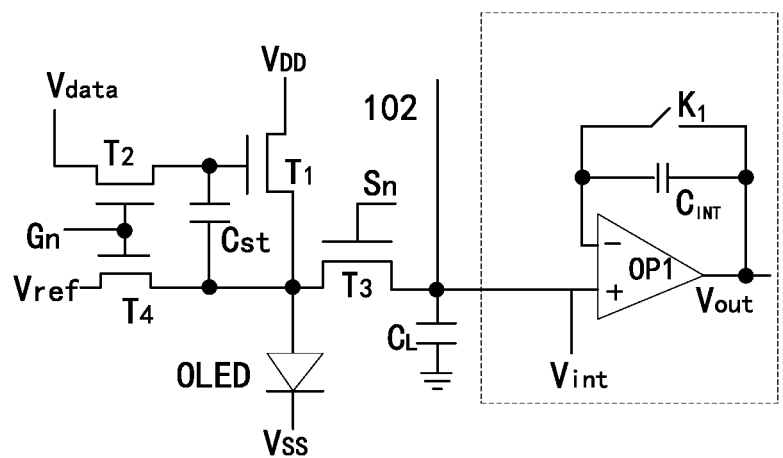
FIG. 7 is a schematic view showing an integration module of the current detection device according to one embodiment of the present disclosure.

In the related art, generally the current detection is performed by an integration module. As shown in FIG. 7, a 4T1C pixel circuitry includes a driving transistor $T_1$, a first switching transistor $T_2$, a sensing control switch $T_3$, a second switching transistor $T_4$, a $C_{st}$ and an OLED.

At the current detection phase, the OLED in FIG. 1A does not emit light, and the current from the driving transistor $T_1$ does not flow through the OLED. When the gate electrode level $G_n$ of the first switching transistor $T_2$ is a high level, the grayscale voltage $V_{data}$ and the reference voltage $V_{ref}$ are written into the gate electrode and the source electrode of the driving transistor $T_1$ and the storage capacitor $C_{st}$. When the gate electrode level $G_n$ of the first switching transistor $T_2$ is a low level, $V_{data}-V_{ref}$ is stored on the storage capacitor $C_{st}$. When the gate electrode control level Sn of the sensing control switch 303 ($T_3$) is a high level, the sensing control switch 303 ($T_3$) is in an on state, so a driving current $I_D$ is generated due to the gate-to-source voltage $V_{GS}$ of the driving transistor $T_1$ under the effect of $V_{data}-V_{ref}$ across the storage capacitor $C_{st}$, and it is calculated through $$I_D = \frac{1}{2}\mu_n C_{OX} \frac{W}{L}(V_{data} - V_{ref} - V_{TH})^2. \tag{8}$$

The driving current $I_D$ flows to the sense line 102 and the integration sub-circuitry 301, and an IR drop occurs on the load capacitor $C_L$. The output voltage $V_{output}$ of the integration sub-circuitry is calculated through $$V_{output} = V_{int} - \int \frac{I_D}{C_I}dt = V_{int} - \tag{9}$$

$$\int \frac{\frac{1}{2}\mu_n C_{OX} \frac{W}{L}(V_{data} - V_{ref} - V_{TH})^2}{C_I}dt,$$

and when the driving current $I_D$ is a constant current, the above formula is simplified into $$V_{output} = V_{int} - \frac{I_D \times t}{C_I}, \tag{10}$$

where μ represents the mobility, Cox represents a capacitance of a gate oxide layer per unit area, W represents a width of a channel of the driving transistor $T_1$, L represents a length of the channel of the driving transistor $T_1$, $V_{TH}$ represents a threshold voltage of the driving transistor $T_1$, $V_{data}$ represents the grayscale voltage of the pixel circuitry, and $V_{ref}$ represents the reference voltage.

However, it is found that there is a large difference between the current on the sense line 102 and a simulated result, and the smaller the current on the sense line 102, the larger the difference.

Hence, based on the above-mentioned current detection device, the present disclosure further provides in some embodiments a method for improving the current detection accuracy, which will be described hereinafter in details in conjunction with the integration sub-circuitry 301.

Figure 8:
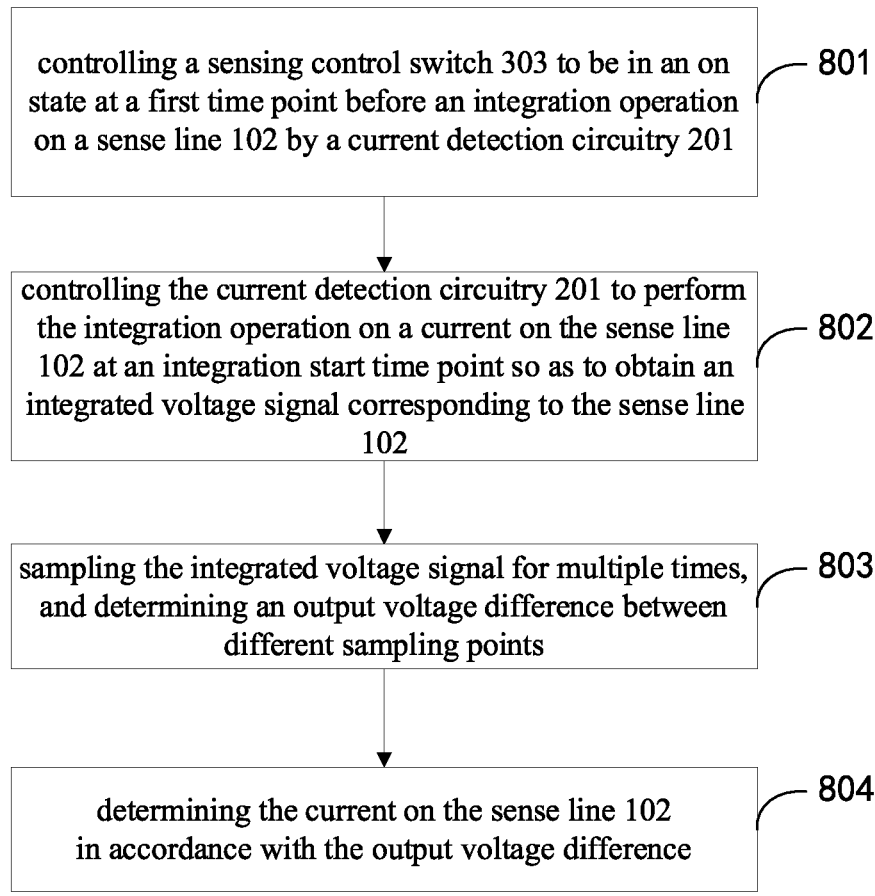
FIG. 8 is a flow chart of a control method for the current detection device according to one embodiment of the present disclosure.

Due to the junction capacitor at the sensing control switch 303 ($T_3$), a voltage jump occurs for the control signal MUX, and thereby the sense line 102 is charged or discharged by the charges in the junction capacitor. Based on the above, the method includes the steps in FIG. 8.

Step 801: controlling the sensing control switch 303 to be in an on state at a first time point before the current detection circuitry 201 performs the integration operation on the sense line 102 (e.g., the first integration time point A in FIGS. 9 and 12). A duration between the first time point and an integration start time point at which the current detection circuitry 201 starts to perform the integration operation (e.g., the second integration time point B in FIGS. 9 and 12) is a first duration. In some embodiments of the present disclosure, as shown in FIG. 9, the first duration is $t_1$, and the sensing control switch 303 is turned on at $t_1$ before the integration operation.

Step 802: controlling the current detection circuitry 201 to perform an integration operation on the current on the sense line 102 at the integration start time point, so as to obtain the integrated voltage signal on the sense line 102.

Step 803: sampling the integrated voltage signal for multiple times, and determining the output voltage difference between different sampling points.

Step 804: determining the current on the sense line 102 in accordance with the output voltage difference.

In some embodiments of the present disclosure, the first duration is related to, but not limited to, the following factors: a voltage jump between the gate electrode and the source electrode of the multiplexer 202, a gate-to-source parasitic capacitance of the multiplexer 202, a parasitic capacitance of the sense line 102, a load capacitance 103 corresponding to the integration sub-circuitry 301 and the sense line 102, and a threshold voltage shift caused by ageing. Usually, the first duration is 2 microseconds to 4 microseconds, for example, 2, 2.5, 3.5, or 4 microseconds.

Through the above-mentioned method, the sensing control switch 303 ($T_3$) is turned on before the integration operation, so it is able to prevent the occurrence of any error in the detected current caused by the junction capacitance.

Ideally, there is a linear relationship between the output voltage of the integration sub-circuitry 301 and the integration time. However, a parasitic load capacitance 103 on the sense line 102 and an open-loop amplification factor of the integrator 401 is not infinitely great, so there is a capacitance balancing phase on the sense line 102 at the initial integration phase. In this process, there is no linear relationship between the output voltage and the integration time. In order to improve the detection accuracy, the current detection shall not be performed at the capacitance balance phase.

Based on the above, in the embodiments of the present disclosure, a duration between a time point when the integrated voltage signal is first sampled and an integration start time point is a second duration, and the second duration is greater than or equal to a duration for the capacitance balance establishment. The duration for capacitance balance establishment is a duration for establishing the balance between the sense line and each of the sensing control switch and the detection circuitry. Before the integration operation performed by the integration sub-circuitry 301 on the sense line 102, the load capacitor is charged within the second duration until the load capacitor is in a balanced state. The second duration is $t_2$ in FIG. 9. Usually, the second duration is about 10 microseconds, for example, 8, 9, 10 or 11 microseconds.

In some embodiments of the present disclosure, the integration operation starts to be performed at $t_3$ as shown in FIG. 9, and the collection switch $K_A$ is turned on. At a time point A', the voltage $V_A$ is stored in the maintenance capacitor $C_A$, and the collection switch $K_B$ is turned on. At a time point B', the voltage $V_B$ is stored in the maintenance capacitor $C_B$. Hence, it is able to obtain the voltage difference between the time point A' and the time point B'.

In some embodiments of the present disclosure, the second duration is inversely related to the current on the sense line 102, i.e., the smaller the current on the sense line 102, the longer the second duration.

Another important factor that influences the current detection accuracy is a leakage current, as shown in Table 1.

TABLE 1

| $V_{GS}$ | $C_{INT}$ | Integration duration | $T_1$ current | Output voltage | $C_{INT}$ Current | Error |
|---|---|---|---|---|---|---|
| 1.0 V | 0.25 pF | 5 µs | 0.031 nA | 4.0959 V | 0.005 nA | 83.87% |
| 1.2 V | 0.25 pF | 5 µs | 0.228 nA | 4.0929 V | 0.155 nA | 32.02% |

TABLE 1-continued

| $V_{GS}$ | $C_{INT}$ | Integration duration | $T_1$ current | Output voltage | $C_{INT}$ Current | Error |
|---|---|---|---|---|---|---|
| 1.4 V | 0.25 pF | 5 µs | 1.08 nA | 4.0795 V | 0.825 nA | 23.64% |
| 1.6 V | 0.25 pF | 5 µs | 3.665 nA | 4.0401 V | 2.795 nA | 22.86% |
| 1.8 V | 0.25 pF | 5 µs | 9.743 nA | 3.9457 V | 7.515 nA | 22.68% |
| 2.0 V | 0.25 pF | 5 µs | 21.37 nA | 3.7656 V | 16.52 nA | 22.57% |
| 2.2 V | 0.25 pF | 5 µs | 40.26 nA | 3.4725 V | 31.18 nA | 22.73% |
| 2.4 V | 0.25 pF | 5 µs | 67.4 nA | 3.0545 V | 52.08 nA | 22.46% |
| 2.5 V | 0.25 pF | 5 µs | 102.8 nA | 2.502 V | 79.7 nA | 22.58% |

In Table 1, $V_{GS}$ is the voltage difference between a gate electrode voltage and a source electrode voltage of the driving transistor $T_1$, V is volt (V), $C_{INT}$ is the integration capacitance, pF is picofarad, and nA is nanoamps.

Figure 10A:
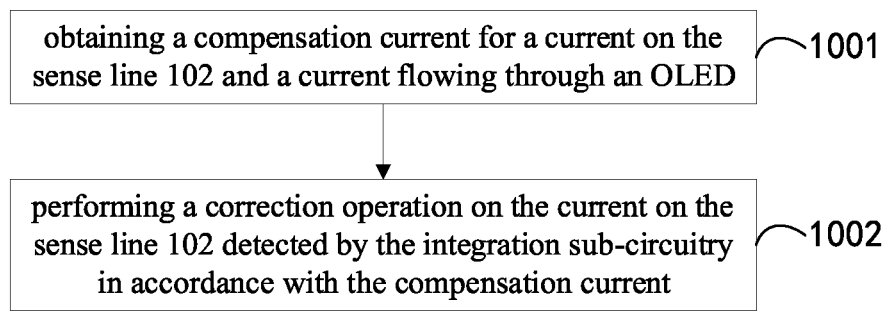
FIG. 10A is a flow chart of a step of modifying a current by the current detection device according to one embodiment of the present disclosure.

Based on the experimental data in Table 1 and the formula $V_{GS}=V_{data}-V_{ref}$, in the case of different grayscale voltages $V_{data}$, the error between the actual current on the sense line and the simulation result is close to 22%, and the error is much larger in the case of a small current. Hence, in the embodiments of the present disclosure, when there is the leakage current, the current on the sense line 102 is determined in accordance with the output voltage corresponding to the specified integration time, and when the current on the sense line 102 is smaller than a predetermined value, a compensation current for the sense line 102 is obtained. Then, a correction operation is performed on the current on the sense line 102 in accordance with the compensation current. The predetermined value is a current value calculated in accordance with the experimental data, and when the measured current is less than the calculated current, there is the leakage current. At this time, a method in FIG. 10A is used to correct the current. It should be appreciated that, when there is no leakage current (namely, the measured current is equal to the calculated current), it is unnecessary to correct the current.

As shown in FIG. 10A, in Step 1001, a compensation current for the current on the sense line 102 and the current flowing through the OLED is obtained.

In some embodiments of the present disclosure, the compensation current is determined as follows. The driving voltage is written into the driving transistor $T_1$ in the pixel circuitry corresponding to the sense line 102, and the gate-to-source voltage of the driving transistor $T_1$ is smaller than the threshold voltage $V_{th}$ of the driving transistor $T_1$. Then, a zero current is supplied to the sense line 102. At this time, the current on the sense line 102 detected by the current detection device is the compensation current.

In some embodiments of the present disclosure, the value of the driving voltage is determined in accordance with a parameter of the sense line 102, and the parameter of the sense line 102 when the driving voltage is obtained is the same as the parameter of the sense line 102 when the current on the sense line 102 is detected by the integration sub-circuitry 301. During the implementation, the driving voltage may be set according to the practical need.

In some another embodiments of the present disclosure, when the current compensation is performed for the sense line 102 for the first time, the driving voltage corresponding to the sense line 102 is determined in accordance with the parameter of the sense line 102, and then stored in a database (not shown). When the current compensation needs to be performed on the sense line 102 subsequently, the driving voltage corresponding to the sense line 102 is directly obtained from the database for the current compensation.

In Step 1002, a correction operation is performed on the current on the sense line 102 detected by the integration sub-circuitry 301 in accordance with the compensation current.

That is, the actual current on the sense line 102 is a sum of the detected current and the compensation current.

It should be appreciated that, one or more of the above-mentioned methods may be used to increase the current detection accuracy according to the practical needs.

Figure 10B:
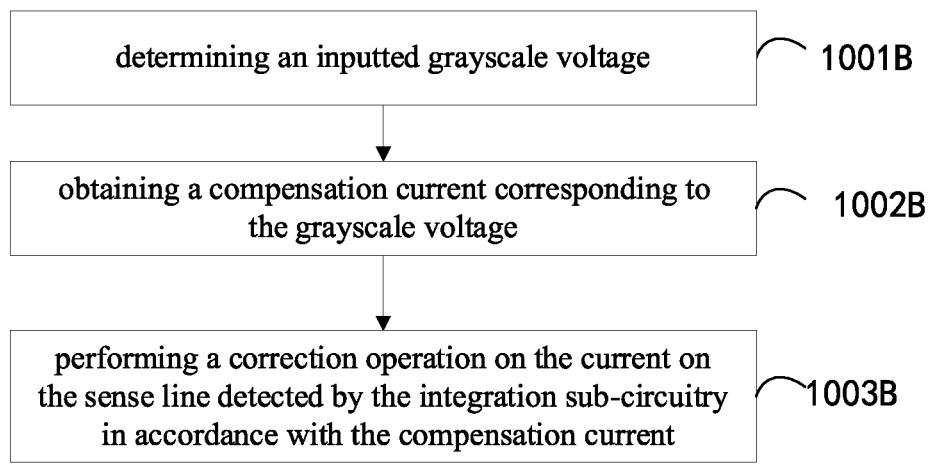
FIG. 10B is a flow chart of a step of modifying currents at different grayscales by the current detection device according to one embodiment of the present disclosure.

The corresponding compensation currents are for different grayscale voltages. During the implementation, as shown in FIG. 10B, a process of compensating for the current includes the following steps.

Step 1001B: determining an inputted grayscale voltage.

Step 1002B: obtaining a compensation current corresponding to the grayscale voltage.

Step 1003B: performing a correction operation on the current on the sense line 102 detected by the integration sub-circuitry 301 in accordance with the compensation current.

Table 2 shows the simulation data obtained by using the current detection device and the current compensation method.

At the resetting phase, the detected voltage on the sense line 102 is $V_{ref}$, so the multiplexer 202 (MUX$_1$) corresponding to the sense line 102 is in an on state. The resetting signal Reset is at a high level, and at this time, the resetting control switch 406 (TRST) is in an on state. The voltage on the sense line 102 is reset to the initial voltage $V_{int}$.

At the capacitance balance phase ($t_1$), the sensing control switch 303, the multiplexer 202 and the resetting switch $K_1$ are in an on state.

At the sampling phase ($t_s$+T), the collection switch $K_A$ is turned on for sampling. At the time point A', the voltage $V_A$ is collected and stored in the maintenance capacitor $C_A$. After T, the collection switch $K_B$ is turned on for sampling, and at the time point B', the voltage $V_B$ is collected and stored in the maintenance capacitor $C_B$.

The detection of the current on a plurality of sense lines through one current detection circuitry will be described with reference to FIGS. 1A, 11 and 12. It is assumed that the plurality of sense lines includes sense lines 1–n. The data write-in operation and the resetting operation are simultaneously performed by the pixel circuitries coupled to the sense lines 1–n respectively. After the resetting phase, when the current on the sense line 1 needs to be detected, only the

TABLE 2

| $V_{GS}$ | $C_{INT}$ | Integration duration | $T_1$ current | Output voltage collected for the first time | Output voltage collected for the second time | Detected current | Compensation current | Accuracy |
|---|---|---|---|---|---|---|---|---|
| 1.0 V | 0.0625 pF | 10 μs | 0.0001 nA | 4.0131 V | 4.047 V | −0.05297 nA | 0 nA | |
| 2.1 V | 0.0625 pF | 10 μs | 0.082 nA | 3.9936 V | 3.9978 V | 0.025 nA | 0.078 nA | 94.99% |
| 2.3 V | 0.0625 pF | 10 μs | 0.475 nA | 3.897 V | 3.6382 V | 0.406 nA | 0.459 nA | 96.61% |
| 2.5 V | 0.0625 pF | 10 μs | 1.911 nA | 3.5482 V | 2.3868 V | 1.815 nA | 1.868 nA | 97.73% |
| 2.7 V | 0.0625 pF | 10 μs | 6.152 nA | 3.4768 V | 2.5099 V | 6.043 nA | 6.096 nA | 99.09% |
| 2.9 V | 0.0625 pF | 10 μs | 15.81 nA | 2.6508 V | 0.13219 V | 15.79 nA | 15.79 nA | 99.91% |

In Table 2, $V_{GS}$ is the gate-to-source voltage of the driving transistor $T_1$, V is volt (V), $C_{INT}$ is the integration capacitance, pF is picofarad, and nA is nanoamps.

As shown in Table 2, after the current compensation, the current detection accuracy is significantly improved in the case of a small current.

For ease of understanding, an overall structure of the current detection device will be described hereinafter in more retails.

As shown in FIG. 11, in the case that one detection circuitry corresponds to three sense lines, the current detection device includes sense lines 102, i.e., sense 1-sense3, a first multiplexer 202 (MUX1), a second multiplexer 202 (MUX2), a third multiplexer 202 (MUX3), a load capacitor 103 $C_{SL}$, a low noise operational amplifier OP$_1$, a resetting switch $K_1$, an integration capacitor $C_{INT}$, collection switches $K_A$ and $K_B$, maintenance capacitors $C_A$ and $C_B$, high input impedance followers OP$_3$ and OP$_4$, a subtractor OP$_5$, resistors R1, R2, R3 and R4, a digital-to-analogue conversion circuitry 302, a reference level control switch 404 (TWR), a resetting control switch 406 (TRST), a follower amplifier OP$_2$, and a pixel circuitry. The pixel circuitry includes a first switching transistor $T_2$, a driving transistor $T_1$, a sensing control switch 303 ($T_3$), a capacitor $C_{st}$ and an OLED (only the sensing control switch 303 is shown in FIG. 11).

As shown in FIG. 12, at the data write-in phase, the gate electrode $G_n$ of the sensing control switch 303 ($T_3$) corresponding to the sense line 102, a write-in voltage and an Sn signal are at a high level. At this time, the first switching transistor $T_2$ and the reference level control switch 404 (TWR) are in an on state.

first multiplexer 202 (MUX$_1$) coupled to the sense line 1 is in an on state, and the multiplexers corresponding to the sense lines 2-n are in an off state. Then, the capacitance balancing operation and the sampling operation are performed merely on the sense line 1, so as to detect the current on the sense line 1. After the current detection on the sense line 1, the first multiplexer 202 (MUX$_1$) coupled to the sense line 1 is turned off. When the current on the sense line 2 needs to be detected, the second multiplexer 202 (MUX$_2$) coupled to the sense line 2 is turned on, and the capacitance balancing operation and the sampling operation are performed on the sense line 2, so as to detect the current on the sense line 2. When the current detection needs to be performed on a sense line m, only an m$^{th}$ multiplexer 202 (MUX$_m$) coupled to the sense line m is in an on state, and then the capacitance balancing operation and the sampling operation are performed on the sense line n, so as to detect the current on the sense line m. In this way, the current detection is performed on each sense line individually, until the current on all the n sense lines have been detected.

The operations on each sense line will be described as follows by taking the sense line 1 as an example. At the data write-in phase, the sensing control switch 303 ($T_3$) coupled to the sense line 1 and the first switching transistor $T_2$ in the pixel circuitry 1 are turned on, the reference level control switch 404 (TWR) in the current detection circuitry is turned on, and the first multiplexer 202 (MUX$_1$) coupled to the sense line 1 is turned on, so a potential at the source electrode of the driving transistor $T_1$ in the pixel circuitry 1 is the reference voltage $V_{ref}$. At the resetting phase, the first switching transistor $T_2$ and the sensing control switch 303

(T$_3$) in the pixel circuitry 1 coupled to the sense line 1 are turned off, and the resetting control switch 406 (TRST) is turned on, so the potential at the sense line 1 is the initial voltage V$_{int}$. At the capacitance balance phase, the resetting control switch 406 (TRST) is turned off, and at the first time point A before the integration, the first multiplexer 202 (the MUX$_1$) and the resetting switch K$_1$ are turned off. After the sampling phase, the collection switch K$_A$ is turned on for sampling, and at the time point A', the voltage V$_A$ is collected and stored in the maintenance capacitor C$_A$. After T, the collection switch K$_B$ is turned on for sampling, and at the time point B', the voltage V$_B$ is collected and stored in the maintenance capacitor C$_B$. The current on the sense line is determined in accordance with the voltage difference between the time point A' and the time point B'.

Hence, when detecting the current on the sense line 2 corresponding to the second multiplexer 202 (MUX$_2$), it is unnecessary to perform the data write-in operation and the resetting operation again, and at the capacitance balance phase, the resetting control switch 406 (TRST) is turned off. At the first time point A before the second integration, the second multiplexer 202 (MUX$_2$) and the resetting switch K$_1$ are turned on. At the sampling phase, the collection switch K$_A$ is turned on for sampling, and at the time point A', the voltage V$_A$ is collected and stored in the maintenance capacitor C$_A$. After T, the collection switch K$_B$ is turned on for sampling, and at the time point B', the voltage V$_B$ is collected and stored in the maintenance capacitor C$_B$. The current on the sense line is determined in accordance with the voltage difference between the time point A' and the time point B'.

Based on the above, when one detection circuitry is coupled to n sense lines and there are n pixel circuitries, the operations will be described as follows.

When the current on the sense line 1 coupled to the first multiplexer 202 (MUX$_1$) is detected, at the data write-in phase, the sensing control switch 303 (T$_3$) coupled to the sense line 102, the first switching transistor T$_2$ in the pixel circuitry 1, the pixel circuitry 2, the pixel circuitry 3, . . . , and the pixel circuitry n are turned on, the reference level control switch 404 (TWR) in the current detection circuitry is turned on, and the first multiplexer 202 (MUX$_1$) coupled to the sense line 1, the second multiplexer 202 (MUX$_2$) coupled to the sense line 2, the third multiplexer 202 (MUX$_3$) coupled to the sense line 3, . . . , and the n$^{th}$ multiplexer 202 (MUX$_n$) coupled to the sense line n are all turned on. The potentials at the source electrodes of the driving transistors T$_1$ in the pixel circuitry 1, the pixel circuitry 2, the pixel circuitry 3, . . . , and the pixel circuitry n are all reference voltages V$_{ref}$. At the resetting phase, the first switching transistor T$_2$ and the sensing control switch 303 (T$_3$) in the pixel circuitry 1, the first switching transistor T$_2$ and the sensing control switch 303 (T$_3$) in the pixel circuitry 2, the first switching transistor T$_2$ and the sensing control switch 303 (T$_3$) in the pixel circuitry 3, . . . , and the first switching transistor T$_2$ and the sensing control switch 303 (T$_3$) in the pixel circuitry n are all turned off. The resetting control switch 406 (TRST) is turned on, and the potentials at the sense line 1, the sense line 2, the sense line 3, . . . , and the sense line n are reset to the initial voltage V$_{int}$. When the current on the sense line 1 coupled to the first multiplexer 202 (MUX$_1$) is to be detected, at the capacitance balance phase, the resetting control switch 406 (TRST) is turned off, the first multiplexer 202 (MUX1) is turned on, and the multiplexers 202 (MUX) corresponding to other sense lines are turned off. At the first time point A before the first integration, the multiplexer 202 (MUX1) and the resetting switch K$_1$ are turned on. After the capacitance balance phase, the collection switch K$_A$ is turned on for sampling, and at the time point A', the voltage V$_A$ is collected and stored in the maintenance capacitor C$_A$. After T, the collection switch K$_B$ is turned on for sampling, and at the time point B', the voltage V$_B$ is collected and stored in the maintenance capacitor C$_B$. The current on the sense line is determined in accordance with the voltage difference between the time point A' and the time point B'.

When the current on the sense line 2 is to be detected, the second multiplexer 202 (MUX$_2$) is turned on, and the multiplexers 202 (MUX) corresponding to the other sense lines are turned off. At the first time point A before the second integration, the second multiplexer 202 (MUX$_2$) and the resetting switch K$_1$ are turned on. After the capacitance balance phase, the collection switch K$_A$ is turned on for sampling, and at the time point A', the voltage V$_A$ is collected and stored in the maintenance capacitor C$_A$. After T, the collection switch K$_B$ is turned on for sampling, and at the time point B', the voltage V$_B$ is collected and stored in the maintenance capacitor C$_B$. The current on the sense line is determined in accordance with the voltage difference between the time point A' and the time point B'. The detection of the currents on the n sense lines coupled to the detection circuitry is the same as that mentioned hereinabove, and thus will not be particularly defined herein.

Based on the above, it is able to use the same current detection device to detect the currents on a plurality of sense lines. The quantity of multiplexers 202 (MUX) and sense lines 102 will not be particularly defined herein. In addition, the method for detecting the currents on the sense lines corresponding to the multiplexers 202 (MUX$_{3-n}$) is the same as that corresponding to MUX$_1$ and MUX$_2$, which also falls within the scope of the present disclosure.

The method for detecting the current on the sense line through the integration sub-circuitry 301 in FIG. 4B has been described hereinabove, and the method for detecting the current on the sense line through the integration sub-circuitry 301 in FIGS. 4C and 4D will be described hereinafter. The processing of the integration sub-circuitry at the data write-in phase, the resetting phase and the capacitance balance phase are the same, and thus will not be particularly defined herein. Merely the operations at the sampling phase will be described hereinafter in details.

As shown in FIG. 4D, the integration sub-circuitry 301 includes a multiplexer 408, a plurality of voltage collection circuitries 407 and a digital-to-analogue conversion circuitry 302. The plurality of voltage collection circuitries 407 includes at least two groups of voltage collection circuitries 407 (only two groups are shown in FIG. 4D), so as to sample the integrated voltage signal for multiple times and determine the output voltage difference between different sampling points. To be specific, one group of voltage collection circuitries 407 sample the integrated voltage signal on the sense line for multiple times to obtain and save a plurality of sampling points, and the remaining groups of voltage collection circuitries 407 sample the integrated voltage signal on the other sense line for multiple times to obtain and save a plurality of sampling points when the current detection is performed on the other sense line. At a specific occasion for detecting the current on a next sense line, the group of voltage collection circuitries which store the sampling points are enabled through the multiplexer 408, so as to obtain the plurality of sampling points and determine the output voltage difference in accordance with the plurality of sampling points.

In some embodiments of the present disclosure, the specified occasion is before the sampling of the integrated voltage signal on a next sense line through the integration sub-circuitry 301, and after the multiplexer 202 corresponding to the next sense line is turned on.

For example, as shown in FIGS. 4D and 13, when sampling the sense line 1, at the integration start time point B, the integration control switch $K_1$ is turned off, the low noise operational amplifier $OP_1$ in the integrator 401 is in an open-loop integration state, and the multiplexer 202 (at a high level as shown in FIG. 13) and the sensing control switch 303 (at a high level as shown in FIG. 13) are turned on, so the driving current outputted by the driving transistor $T_1$ under the effect of the storage capacitor $C_{st}$ flows through the sensing control switch 303, the sense line 102, and the multiplexer 202 (MUX) to the integration capacitor $C_{INT}$. As shown in FIG. 13, the output voltage $V_{OP1}$ of the integrator decreases along with time when $K_1$ is switched from an on state to an off state. After $t_s$, the output voltage $V_{OP1}$ of the integrator decreases from $V_{int}$ to $V_{1A}$, and $CDS_{1A}$ of the voltage collection circuitry 407 is turned on for sampling, so as to obtain the voltage $V_{1A}$ and store it in the maintenance capacitor $C_{1A}$. After T, the integrated voltage drops from $V_{1A}$ to $V_{1B}$, and $CDS_{1B}$ of the voltage collection circuitry 407 is turned on for sampling, so as to obtain the voltage $V_{1B}$ and store it in the maintenance capacitor $C_{1B}$. After saving the plurality of sampling points, the multiplexer 202 between the sense line 1 and the current detection circuitry is turned off, and the multiplexer 202 between the sense line 2 and the current detection circuitry is turned on, so as to detect the current on the sense line 2. After the capacitance balance phase has been ended, when $K_1$ is switched from an on state to an off state, the output voltage $V_{OP1}$ of the integrator decreases along with time. After $t_s$, the output voltage $V_{OP1}$ of the integrator decreases from $V_{int}$ to $V_{2A}$, and $CDS_{2A}$ of the voltage collection circuitry 407 is turned on for sampling, so as to obtain the voltage $V_{2A}$ and store it in the maintenance capacitor $C_{2A}$. After T, the integrated voltage drops from $V_{2A}$ to $V_{2B}$, and $CDS_{2B}$ of the voltage collection circuitry 407 is turned on for sampling, so as to obtain the voltage $V_{2B}$ and store it in the maintenance capacitor $C_{2B}$.

A detection mode for n sense lines is the same as that mentioned hereinabove, and thus will not be particularly defined herein. When the current on the next sense line is detected, the digital-to-analogue conversion is performed on the voltage sampled on the current sense line, so as to improve the detection efficiency.

Based on a same inventive concept, the present disclosure further provides in some embodiments a display device which, as shown in FIG. 2, includes a display panel 200 and the above-mentioned current detection device. The display panel 200 includes an active area AA and a non-active area NB. The active area AA includes a plurality of sub-pixels spx and a plurality of sense lines 102 (SL), and the non-active area NB includes a predetermined power source line. Each sub-pixel spx includes a pixel circuitry, and the pixel circuitries in one column are coupled to a sense line 102 (SL). It should be appreciated that, the display panel 200 is coupled to the current detection device as mentioned hereinabove, which will thus not be particularly defined herein.

During the implementation, in the embodiments of the present disclosure, the display device may be any product or member having a display function such as mobile phone, tablet computer, television, display, laptop computer, digital photo frame or navigator. Other essential components of the display device are known in the art and thus will not be particularly defined herein.

It should be appreciated that, although several circuitries or sub-circuitries of the device have been described hereinabove, they are provided for illustrative purposes only. In actual use, the features and functions of two or more circuitries may be achieved through one circuitry. In contrast, the feature and function of one circuitry may be achieved through a plurality of circuitries.

It should be further appreciated that, although the operations of the method have been described in the drawings in a specific order, it does not require or imply that these operations must be performed in the specific order, or all the operations must be performed to achieve an expected result. In contrast, the steps in the drawings may be performed in any other order. Additionally or alternatively, some steps may be omitted, some steps may be combined as one step, and/or one step may be divided into a plurality of sub-steps.

It should be further appreciated that, the present disclosure may be provided as a method, a system or a computer program product, so the present disclosure may be in the form of full hardware embodiments, full software embodiments, or combinations thereof. In addition, the present disclosure may be in the form of a computer program product implemented on one or more computer-readable storage mediums (including but not limited to disk memory, Compact Disc-Read Only Memory (CD-ROM) and optical memory) including computer-readable program codes.

The present disclosure has been described with reference to the flow charts and/or block diagrams of the method, device (system) and computer program product according to the embodiments of the present disclosure. It should be understood that computer program instructions may be used to implement each of the work flows and/or blocks in the flow charts and/or the block diagrams, and the combination of the work flows and/or blocks in the flow charts and/or the block diagrams. These computer program instructions may be provided to a processor of a common computer, a dedicated computer, an embedded processor or any other programmable data processing devices to create a machine, so that instructions capable of being executed by the processor of the computer or the other programmable data processing devices may create a device to achieve the functions assigned in one or more work flows in the flow chart and/or one or more blocks in the block diagram.

These computer program instructions may also be stored in a computer readable storage that may guide the computer or the other programmable data process devices to function in a certain way, so that the instructions stored in the computer readable storage may create a product including an instruction unit which achieves the functions assigned in one or more flows in the flow chart and/or one or more blocks in the block diagram.

These computer program instructions may also be loaded in the computer or the other programmable data process devices, so that a series of operation steps are executed on the computer or the other programmable devices to create processes achieved by the computer. Therefore, the instructions executed in the computer or the other programmable devices provide the steps for achieving the function assigned in one or more flows in the flow chart and/or one or more blocks in the block diagram.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A current detection device, comprising a plurality of detection circuitries each coupled to a sense line in a display panel, wherein the detection circuitries comprise a current detection circuitry configured to detect a current on the sense line coupled to the current detection circuitry;
    wherein the current detection circuitry comprises an integration sub-circuitry, a reference voltage write-in circuitry and a resetting circuitry;
    one end of the reference voltage write-in circuitry is coupled to at least one sense line, another end of the reference voltage write-in circuitry is coupled to a reference voltage end, and the reference voltage write-in circuitry is configured to write a reference voltage into the at least one sense line; and
    one end of the resetting circuitry is coupled to the at least one sense line, another end of the resetting circuitry is coupled to an initial voltage end and the integration sub-circuitry, and the resetting circuitry is configured to write an initial voltage into the at least one sense line;
    wherein the reference voltage write-in circuitry comprises a reference level control switch, one end of the reference level control switch is coupled to the at least one sense line, and another end of the reference level control switch is coupled to the reference voltage end;
    wherein the resetting circuitry comprises a follower amplifier and a resetting control switch;
    one end of the follower amplifier is coupled to the resetting control switch, another end of the follower amplifier is coupled to the initial voltage end, and the follower amplifier is configured to reset a voltage on the sense line to the initial voltage when the resetting control switch is in an on state; and
    one end of the resetting control switch is coupled to at least one sense line, and another end of the resetting control switch is coupled to the follower amplifier;
    wherein the reference voltage end writes a reference voltage into a source electrode of a driving transistor through the reference level control switch, the sense line and a sensing control switch in a pixel circuitry.

2. The current detection device according to claim 1, wherein the integration sub-circuitry is configured to perform an integration operation on the current on the sense line to obtain an integrated voltage signal, and sample the integrated voltage signal for multiple times to obtain an output voltage difference between different sampling points.

3. The current detection device according to claim 2, wherein the integration sub-circuitry comprises an integrator, at least two voltage collection circuitries, a voltage difference determination circuitry and a digital-to-analogue conversion circuitry, wherein the integrator is configured to perform an integration operation on the current on the sense line to obtain an integrated voltage signal varying over time;
    each voltage collection circuitry is configured to sample the integrated voltage signal and output a sampled voltage to the voltage difference determination circuitry, and the voltage collection circuitries sample the integrated voltage signal in sequence;
    the voltage difference determination circuitry is configured to determine the output voltage difference in accordance with voltages collected by the voltage collection circuitries, and transmit the output voltage difference to the digital-to-analogue conversion circuitry; and
    the digital-to-analogue conversion circuitry is configured to obtain the output voltage difference, convert the output voltage difference from an analogue signal to a digital signal, and output the digital signal to a controller, so that the controller determines the current on the sense line in accordance with the output voltage difference.

4. The current detection device according to claim 3, wherein the voltage collection circuitry comprises a collection switch and a maintenance capacitor, one end of the collection switch is coupled to an output end of the integrator, another end of the collection switch is coupled to a first end of the maintenance capacitor and an input end of the voltage difference determination circuitry, the first end of the maintenance capacitor is coupled to the collection switch, and a second end of the maintenance capacitor is coupled to a ground end.

5. The current detection device according to claim 3, wherein the voltage difference determination circuitry comprises a plurality of subtractors, each subtractor is coupled to two voltage collection circuitries, two input ends of each subtractor are coupled to the two voltage collection circuitries respectively, and an output end of the subtractor is coupled to the digital-to-analogue conversion circuitry.

6. The current detection device according to claim 5, wherein the voltage difference determination circuitry further comprises a plurality of followers with a high input impedance, an input end of each subtractor is coupled to two followers, one end of the follower is coupled to the subtractor, and another end of the follower is coupled to the voltage collection circuitry;
    wherein the voltage difference determination circuitry further comprises a first resistor module and a second resistor module;
    one end of the first resistor module is coupled to a positive input end of the subtractor, and another end of the first resistor module is coupled to an output end of one follower; and
    one end of the second resistor module is coupled to a negative input end of the subtractor, and another end of the second resistor module is coupled to an output end of the other follower;
    wherein the first resistor module comprises a first resistor and a second resistor, one end of the first resistor is coupled to the output end of the follower, another end of the first resistor is coupled to the second resistor and the positive input end of the subtractor, and another end of the second resistor is coupled to a ground end; and
    the second resistor module comprises a third resistor and a fourth resistor, one end of the third resistor is coupled to the output end of the follower, another end of the third resistor is coupled to the fourth resistor and the negative input end of the subtractor, and another end of the fourth resistor is coupled to the output end of the subtractor.

7. The current detection device according to claim 1, wherein one end of the sense line is coupled to the current detection circuitry, and another end of the sense line is coupled to the sensing control switch in the pixel circuitry.

8. The current detection device according to claim 1, wherein the current detection circuitry comprises an integration sub-circuitry, the integration sub-circuitry comprises an integrator, a digital-to-analogue conversion circuitry, a multiplexer and a plurality of voltage collection circuitries, and the plurality of voltage collection circuitries comprises at least two groups of voltage collection circuitries;
    the integrator is configured to perform an integration operation on the current on the sense line to obtain an integrated voltage signal varying over time;

one group of voltage collection circuitries in the at least two groups of voltage collection circuitries are configured to sample the integrated voltage signal on the sense line for multiple times to obtain and store a plurality of sampling points, and the remaining groups of voltage collection circuitries in the at least two groups of voltage collection circuitries are configured to sample an integrated voltage signal on the other sense line for multiple times to obtain and store a plurality of sampling points when current detection is performed on the other sense line; and the digital-to-analogue conversion circuitry is configured to perform analogue-to-digital conversion on the sampling point for the sense line to obtain a digital signal and output the digital signal to a controller, so that the controller determines the current on the sense line in accordance with the digital signal.

9. The current detection device according to claim 8, wherein the at least two groups of voltage collection circuitries comprises a first group of voltage collection circuitries and a second group of voltage collection circuitries;

one group of voltage collection circuitries in the first group of voltage collection circuitries and the second group of voltage collection circuitries are configured to sample the integrated voltage signal on the sense line for multiple times to obtain and save a plurality of sampling points; and the other group of voltage collection circuitries in the first group of voltage collection circuitries and the second group of voltage collection circuitries are configured to sample the integrated voltage signal on a next sense line for multiple times so as to obtain and save a plurality of sampling points when current detection is performed on the next sense line.

10. The current detection device according to claim 8, wherein the integration sub-circuitry further comprises a multiplexer, one end of the multiplexer is coupled to the plurality of voltage collection circuitries, another end of the multiplexer is coupled to the digital-to-analogue conversion circuitry, and the multiplexer is configured to enable a group of voltage collection circuitries for saving the sampling points of the sense line at a specified occasion when current detection is performed by the current detection circuitry on a next sense line.

11. The current detection device according to claim 10, wherein the current detection circuitry further comprises a voltage difference determination circuitry, one end of the voltage difference determination circuitry is coupled to the multiplexer, another end of the voltage difference determination circuitry is coupled to the digital-to-analogue conversion circuitry, the voltage difference determination circuitry is configured to determine an output voltage difference between the plurality of sampling points for the sense line, and the digital-to-analogue conversion circuitry is specifically configured to perform analogue-to-digital conversion on the output voltage difference to obtain the digital signal.

12. The current detection device according to claim 10, wherein the specified occasion is before the sampling of an integrated voltage signal on the next sense line by the integration sub-circuitry and after the current detection on the next sense line.

13. The current detection device according to claim 10, wherein the voltage collection circuitry comprises an collection switch and a maintenance capacitor, one end of the collection switch is coupled to an output end of the integrator, another end of the collection switch is coupled to a first end of the maintenance capacitor and the multiplexer, the first end of the maintenance capacitor is coupled to the collection switch, and a second end of the maintenance capacitor is coupled to a ground end.

14. The current detection device according to claim 10, wherein the voltage difference determination circuitry comprises a plurality of subtractors, each subtractor is coupled to two voltage collection circuitries, two input ends of the subtractor are coupled to the two voltage collection circuitries through the multiplexer respectively, and an output end of the subtractor is coupled to the digital-to-analogue conversion circuitry.

15. The current detection device according to claim 8, wherein the integration sub-circuitry further comprises a protection circuitry, the protection circuitry comprises a resistor module and a control switch connected in parallel to each other, one end of the protection circuitry is coupled to the output end of the integrator, and another end is coupled to the voltage collection circuitries.

16. The current detection device according to claim 1, wherein the detection circuitry further comprises a plurality of multiplexers, one end of each multiplexer is coupled to the current detection circuitry, another end of each multiplexer is coupled to the sense line, and different multiplexers are in an on state at different times.

17. A display device comprising a display panel and the current detection device according to claim 1, wherein the display panel comprises an active area and a non-active area, the active area comprises a plurality of sub-pixels and a plurality of sense lines, each sub-pixel comprises a pixel circuitry, the pixel circuitries in one column are coupled to one of the sense lines, the non-active area comprises a preset power source line, a reference voltage write-in circuitry of the detection circuitry and a resetting circuitry, and a first end of the current detection circuitry in each detection circuitry is coupled to a corresponding sense line.

* * * * *